(12) United States Patent
Koyama et al.

(10) Patent No.: US 11,279,802 B2
(45) Date of Patent: Mar. 22, 2022

(54) ALKALI-SOLUBLE RESIN, PHOTOSENSITIVE RESIN COMPOSITION, PHOTOSENSITIVE SHEET, CURED FILM, INTERLAYER INSULATING FILM OR SEMICONDUCTOR PROTECTIVE FILM, PRODUCTION METHOD FOR RELIEF PATTERN OF CURED FILM, AND ELECTRONIC COMPONENT OR SEMICONDUCTOR DEVICE

(71) Applicant: TORAY INDUSTRIES, INC., Tokyo (JP)

(72) Inventors: Yutaro Koyama, Otsu (JP); Yuki Masuda, Otsu (JP); Masao Tomikawa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 85 days.

(21) Appl. No.: 16/969,315

(22) PCT Filed: Mar. 15, 2019

(86) PCT No.: PCT/JP2019/010816
§ 371 (c)(1),
(2) Date: Aug. 12, 2020

(87) PCT Pub. No.: WO2019/181782
PCT Pub. Date: Sep. 26, 2019

(65) Prior Publication Data
US 2021/0047470 A1 Feb. 18, 2021

(30) Foreign Application Priority Data
Mar. 22, 2018 (JP) .............................. JP2018-053856

(51) Int. Cl.
*C08G 73/10* (2006.01)
*G03F 7/038* (2006.01)
(Continued)

(52) U.S. Cl.
CPC ....... *C08G 73/1078* (2013.01); *G03F 7/0387* (2013.01); *H01L 23/3128* (2013.01);
(Continued)

(58) Field of Classification Search
CPC ............ C08G 73/1042; C08G 73/1046; C08G 73/22; C08G 69/265; C08G 69/40;
(Continued)

(56) References Cited

U.S. PATENT DOCUMENTS 10,584,205 B2 * 3/2020 Shoji ......................... G03F 7/20
11,174,350 B2 * 11/2021 Masuda ................. C08G 73/10
(Continued)

FOREIGN PATENT DOCUMENTS

JP 5446203 B2 3/2014
JP 5953796 B2 7/2016

*Primary Examiner* — Caleen O Sullivan
(74) *Attorney, Agent, or Firm* — Birch, Stewart, Kolasch & Birch, LLP

(57) ABSTRACT

The present invention provides an alkali-soluble resin with which a cured film having high extensibility, reduced stress, high adhesion to a metal, and high heat resistance can be obtained, and a photosensitive resin composition containing the alkali-soluble resin, and the present invention is an alkali-soluble resin (A) including a structure represented by a general formula (1) wherein $X^1$ represents a divalent organic group having 2 to 100 carbon atoms, $Y^1$ and $Y^2$ each represent a divalent to hexavalent organic group having 2 to 100 carbon atoms, $X^2$ represents a tetravalent organic group having 2 to 100 carbon atoms, p and q each represent an integer in a range of 0 to 4, and $n^1$ and $n^2$ each represent an integer in a range of 5 to 100,000, wherein (I) and (II)

(Continued)

described below are satisfied: (I) an organic group having an aliphatic chain having 8 to 30 carbon atoms is contained as $X^1$ of the general formula (1) at a content of 30 to 70 mol % based on 100 mol % of a total of $X^1$ and $X^2$, and (II) an organic group having a diphenyl ether structure is contained as $Y^1$ of the general formula (1) at a content of 1 to 30 mol % based on 100 mol % of a total of $Y^1$ and $Y^2$.

17 Claims, 3 Drawing Sheets

(51) Int. Cl.
- *H01L 23/31* (2006.01)
- *H01L 23/498* (2006.01)
- G03F 7/16 (2006.01)
- G03F 7/20 (2006.01)
- G03F 7/32 (2006.01)
- G03F 7/40 (2006.01)

(52) U.S. Cl.
CPC .......... *H01L 23/49894* (2013.01); *G03F 7/16* (2013.01); *G03F 7/20* (2013.01); *G03F 7/322* (2013.01); *G03F 7/40* (2013.01)

(58) Field of Classification Search
CPC ................ C08G 69/42; C08G 73/1039; C08G 73/1053; C08G 73/106; C08G 73/1071; C08G 73/1082; C08G 73/14; C08G 73/1078; G03F 7/004; G03F 7/023; G03F 7/039; G03F 7/0233; G03F 7/0757; G03F 7/085; G03F 7/0387; G03F 7/16; G03F 7/20; G03F 7/322; G03F 7/40; H01L 2924/10253; H01L 21/6835; H01L 23/5329; H01L 24/11; H01L 24/13; H01L 24/19; H01L 24/20; H01L 23/3128; H01L 23/49894; H01L 21/568; H01L 23/293; H01L 24/05; H01L 2221/68327; H01L 2224/04105; H01L 2224/05124; H01L 2224/05147; H01L 2224/05166; H01L 2224/05171; H01L 2224/056; H01L 2224/131
USPC ........................................ 430/270.1; 257/668
See application file for complete search history.

(56) References Cited

U.S. PATENT DOCUMENTS

| | | | |
|---|---|---|---|
| 2012/0133061 A1* | 5/2012 | Mitsukura | C09J 7/35 257/798 |
| 2018/0066107 A1* | 3/2018 | Shoji | C08K 5/38 |
| 2019/0081258 A1 | 3/2019 | Masuda et al. | |

* cited by examiner

ALKALI-SOLUBLE RESIN, PHOTOSENSITIVE RESIN COMPOSITION, PHOTOSENSITIVE SHEET, CURED FILM, INTERLAYER INSULATING FILM OR SEMICONDUCTOR PROTECTIVE FILM, PRODUCTION METHOD FOR RELIEF PATTERN OF CURED FILM, AND ELECTRONIC COMPONENT OR SEMICONDUCTOR DEVICE

TECHNICAL FIELD

The present invention relates to an alkali-soluble resin and a photosensitive resin composition containing the alkali-soluble resin. More specifically, the present invention relates to an alkali-soluble resin suitably used in a surface protective film for a semiconductor element or the like, an interlayer insulating film, an insulating layer for an organic electroluminescent device, and the like, and a photosensitive resin composition containing the alkali-soluble resin.

BACKGROUND ART

Conventionally, polyimide-based resins and polybenzoxazole-based resins that are excellent in heat resistance, electrical insulation, and the like have been widely used in a surface protective film and an interlayer insulating film for a semiconductor element, an insulating layer for an organic electrolytic element, and a flattening film for a TFT substrate. Furthermore, photosensitive polyimides and photosensitive polybenzoxazoles provided with photosensitivity have been studied to improve the productivity.

In recent years, as semiconductors have become highly integrated, insulation materials have become multi-layered and thick, and a cured film having high heat resistance and a high mechanical property after the low-temperature curing at around 200° C. is required in order to reduce a heat load on a semiconductor device in a production process and to reduce stress on a substrate wafer.

Regarding this, as a technique of obtaining a cured film having high heat resistance and a high mechanical property, a polybenzoxazole precursor is proposed in which an aliphatic group is introduced into the dicarboxylic acid of the benzoxazole precursor to increase the benzoxazole ring closure rate during heat treatment (Patent Document 1). Furthermore, it has been studied that an adhesion property is improved by copolymerizing benzoxazole with an imide structure (Patent Document 2).

However, in the polybenzoxazole precursor having a high ring closure rate during heat treatment, the stress tends to be insufficiently reduced because the film shrinkage due to the cyclization is large, and in the cyclized benzoxazole structure, the interaction with a metal is weak, and the adhesion property to a metal is insufficient.

Also in the case of copolymerizing benzoxazole with an imide structure, there are some cases in which the adhesion property to a metal and the reduction in stress are insufficient at curing at low temperature.

Regarding this, a resin is reported with which a cured film having a high adhesion property to a metal, and at the same time, having high extensibility and reduced stress can be obtained by introducing an aliphatic chain into the diamine residue of a polyamic acid-polyamide copolymer having a low ring closure rate during heat treatment (Patent Document 3).

PRIOR ART DOCUMENTS

Patent Documents

Patent Document 1: Japanese Patent No. 5953796
Patent Document 2: Japanese Patent No. 5446203
Patent Document 3: International Publication No. 2017/064984

SUMMARY OF THE INVENTION

Problems to be Solved by the Invention

However, in the material as described in Patent Document 3, the stress is insufficiently reduced because the cured film has a high elastic modulus.

The present invention has been made in view of the problems of conventional art as described above, and provides an alkali-soluble resin with which a cured film having high extensibility and a high adhesion property to a metal, and at the same time, having reduced stress due to low elasticity and low shrinkability, and having high heat resistance can be obtained, and a photosensitive resin composition containing the alkali-soluble resin.

Solutions to the Problems

In order to solve the above-described problems, the present invention relates to the following.

An alkali-soluble resin (A) including a structure represented by a general formula (1),
wherein $X^1$ represents a divalent organic group having 2 to 100 carbon atoms, $Y^1$ and $Y^2$ each represent a divalent to hexavalent organic group having 2 to 100 carbon atoms, $X^2$ represents a tetravalent organic group having 2 to 100 carbon atoms, p and q each represent an integer in a range of 0 to 4, and $n^1$ and $n^2$ each represent an integer in a range of 5 to 100,000,
wherein (I) and (II) described below are satisfied:
(I) an organic group having an aliphatic chain having 8 to 30 carbon atoms is contained as $X^1$ of the general formula (1) at a content of 30 to 70 mol % based on 100 mol % of a total of $X^1$ and $X^2$, and
(II) an organic group having a diphenyl ether structure is contained as $Y^1$ of the general formula (1) at a content of 1 to 30 mol % based on 100 mol % of a total of $Y^1$ and $Y^2$.

[Chem. 1]

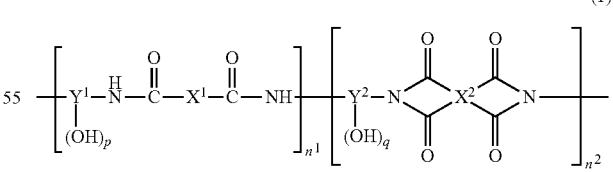

(1)

Effects of the Invention

The present invention provides an alkali-soluble resin with which a cured film having high extensibility, high adhesion to a metal, reduced stress, and high heat resistance can be obtained, and a photosensitive resin composition containing the alkali-soluble resin.

EMBODIMENTS OF THE INVENTION

Figure 1:
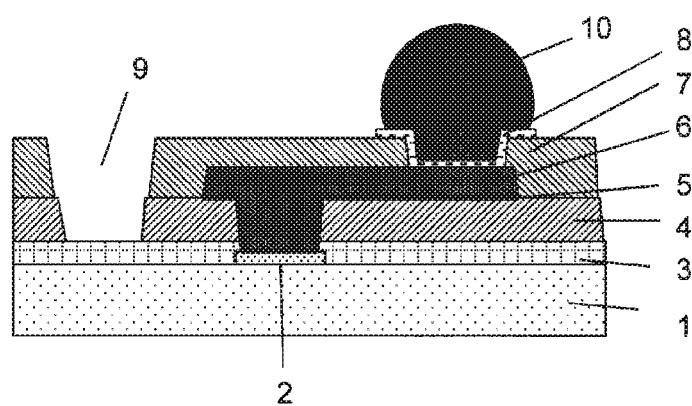
FIG. 1 shows an enlarged section of a pad portion of a semiconductor device having a bump.

The present invention is an alkali-soluble resin (A) including a structure represented by a general formula (1) wherein $X^1$ represents a divalent organic group having 2 to 100 carbon atoms, $Y^1$ and $Y^2$ each represent a divalent to hexavalent organic group having 2 to 100 carbon atoms, $X^2$ represents a tetravalent organic group having 2 to 100 carbon atoms, p and q each represent an integer in a range of 0 to 4, and $n^1$ and $n^2$ each represent an integer in a range of 5 to 100,000, wherein (I) and (II) described below are satisfied:

(I) an organic group having an aliphatic chain having 8 to 30 carbon atoms is contained as $X^1$ of the general formula (1) at a content of 30 to 70 mol % based on 100 mol % of a total of $X^1$ and $X^2$, and (II) an organic group having a diphenyl ether structure is contained as $Y^1$ of the general formula (1) at a content of 1 to 30 mol % based on 100 mol % of a total of $Y^1$ and $Y^2$.

[Chem. 2]

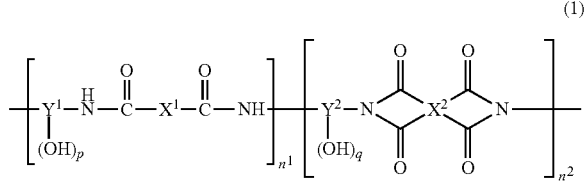

(1)

In the present invention, the term "alkali-soluble" means to have a dissolution rate of 50 nm/min or more. Specifically, the term "alkali-soluble" means to have a dissolution rate determined in the following manner of 50 nm/min or more. A solution of a resin dissolved in γ-butyrolactone is applied to a silicon wafer, the resulting product is prebaked at 120° C. for 4 minutes to form a prebaked film having a thickness of 10 μm±0.5 μm, the prebaked film is immersed in a 2.38% by mass tetramethylammonium hydroxide aqueous solution at 23±1° C. for 1 minute and then subjected to rinse treatment with pure water, and the dissolution rate is determined from the decrease in the thickness.

The alkali-soluble resin (A) represented by the general formula (1) according to the present invention is a resin produced by copolymerizing a polyamide structure and a polyimide structure. The polyamide structure is a benzoxazole precursor having two sets, located in the ortho position to each other, of an amino group and a hydroxy group, another polyhydroxyamide, a polyamide, or a copolymer thereof. The polyimide structure is a polyimide produced by dehydrating and cyclizing a polyamic acid or a polyamic acid ester, or a structure in which a resin end is capped with an imide.

A cured film produced with the alkali-soluble resin (A) can have an improved extensibility because of the presence of the polyamide structure.

Furthermore, a cured film produced with the alkali-soluble resin (A) can have an improved adhesion property to a metal because, owing to the presence of the polyimide structure, the interaction with a metal is higher than in the case that only the polyamide structure is included.

In the case that the alkali-soluble resin (A) according to the present invention satisfies only (I), a cured film having high extensibility and low elasticity can be obtained because of the flexible aliphatic group in the polyamide structure. However, in the case that the polyamide is a polyhydroxyamide having a polybenzoxazole precursor structure, that is, in the case that the alkali-soluble resin (A) contains a polyhydroxyamide having a polybenzoxazole precursor structure, the stress on the cured film tends to be insufficiently reduced because the ring closure rate of the polybenzoxazole structure during heat treatment is simultaneously raised, and the film shrinkage is increased. In the case that the alkali-soluble resin (A) satisfies only (II), a cured film having high adhesion to a metal and high heat resistance can be obtained because of the diphenyl ether structure, but low elasticity cannot be obtained, and the stress tends to be insufficiently reduced. Because the alkali-soluble resin (A) is in the range in which (I) and (II) are satisfied, the stress can be significantly reduced by reducing the elasticity while the film shrinkage due to cyclization is suppressed. It is considered that this is because the rigid structure of diphenyl ether suppresses the flexible movement of the aliphatic chain.

From the viewpoint of obtaining a cured film having high extensibility and low elasticity, the organic group having an aliphatic group having 8 to 30 carbon atoms is contained at a content of 30 mol % or more, preferably 40 mol % or more, and more preferably 45 mol % or more based on 100 mol % of the total of $X^1$ and $X^2$ of the general formula (1). From the viewpoint of obtaining a cured film having a high residual film rate after development and having heat resistance, the organic group is contained at a content of 70 mol % or less, preferably 65 mol % or less, and more preferably 60 mol % or less.

From the viewpoint of obtaining a cured film having a highly suppressed ring closure rate, a high adhesion property to a metal, and high heat resistance, the content of the organic group having a diphenyl ether structure is 1 mol % or more, preferably 5% or more, and more preferably 10% or more based on 100 mol % of the total of $Y^1$ and $Y^2$ of the general formula (1). From the viewpoint of obtaining alkali-solubility and obtaining a cured film having high extensibility and low elasticity, the content is 30 mol % or less, preferably 25% or less, and more preferably 20% or less.

In the general formula (1), $n^1$ and $n^2$ represent the molar ratio in the structure represented by the general formula (1), and $n^1$ and $n^2$ represent the molar ratio between the polyamide structure and the polyimide structure. In order to obtain a resin composition having good processability and a cured film having high extensibility, a low elastic modulus, a high adhesion property, and heat resistance, $n^1$ and $n^2$ are preferably in the range (III) described below.

(III) $n^1$ and $n^2$ of the general formula (1) satisfy $n^1/n^2=10$ to 20

From the viewpoint that, owing to the polyamide structure, appropriate alkali-solubility and a cured film having high extensibility and a low elastic modulus can be obtained, $n^1/n^2$ is preferably 10 or more, and more preferably 15 or more. From the viewpoint that a cured film having a high adhesion property to a metal and heat resistance that are due to the polyimide structure can be obtained, $n^1/n^2$ is preferably 20 or less.

It is possible to confirm $n^1$ and $n^2$ by a method of detecting the peaks of the polyamide structure and the imide structure in an obtained resin, resin composition, or cured film using a nuclear magnetic resonance apparatus (NMR). In the case of the analysis from the resin alone, $n^1$ and $n^2$ can be confirmed by calculating the area ratio of the peak specific to each monomer component in the $^1$H-NMR spectrum. In the case of the analysis from the resin composition or the cured film, extraction and concentration with an organic solvent is performed, and the NMR peak area ratio is calculated in the same manner. In the case that the extraction with an organic solvent is impossible, $n^1$ and $n^2$ can be confirmed by calculating the peak intensity ratio of the polyamide structure or the imide structure from the infrared absorption spectrum. In the case that the molar ratio of the monomers used in the polymerization is known, $n^1$ and $n^2$ can be calculated from the mixing molar ratio of the monomers.

The sequence of the repeating units of the general formula (1) may be in a block manner or in a random manner, and it is more preferable to block-copolymerize the polyamide unit and the polyimide unit because high extensibility and low elasticity that are due to the polyamide and an adhesion property to a metal due to the polyimide can be easily obtained.

From the viewpoints of reducing the elasticity and of heat resistance, the aliphatic chain having 8 to 30 carbon atoms that is contained in the alkali-soluble resin (A) according to the present invention is preferably a linear alkyl group. Specific examples of the carboxylic acid or the carboxylic acid derivative having such a linear alkyl group include aliphatic dicarboxylic acids such as suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, and triacontanedioic acid, and compounds produced by substituting an active carboxylic acid group represented by the following general formula for the carboxylic acid group in the above-described aliphatic dicarboxylic acids.

[Chem. 3]

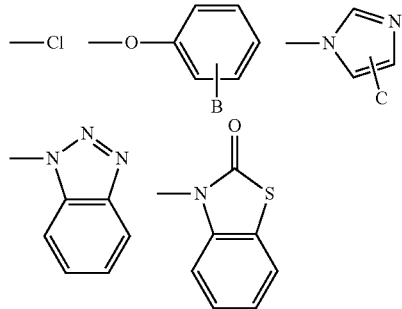

In the formula, B and C are each independently a hydrogen atom, a methyl group, an ethyl group, a propyl group, an isopropyl group, a t-butyl group, a trifluoromethyl group, a halogen group, a phenoxy group, a nitro group, or the like, and not limited thereto.

Among the above-described active carboxylic acid groups, active carboxylic acid groups other than chloride compounds are preferably used. By using the active carboxylic acid group other than chloride compounds, chlorine ions in the obtained resin can be reduced, and separation from a metal substrate due to the presence of chlorine ions can be prevented. A diimidazolide compound is more preferably used as the active carboxylic acid group. The leaving group of the diimidazolide compound is water-soluble imidazole, so that the obtained resin can be reprecipitated and washed with water. Furthermore, the leaved imidazole is basic, so that when a polyimide precursor structure is copolymerized, the imidazole acts as a ring-closing promoter for the polyimide precursor structure during the polymerization, and some of the polyimide precursors can be imidized during the production of a resin by the polymerization reaction.

Examples of the diamine having a diphenyl ether structure used in the alkali-soluble resin (A) include 3,4'-diaminodiphenyl ether, 4,4'-diaminodiphenyl ether, bis{4-(4-aminophenoxy)phenyl}ether, and diamines produced by introducing a hydroxy group into the above-described diamines, and among these diamines, 4,4-diaminodiphenyl ether is particularly preferable.

In the alkali-soluble resin (A) represented by the general formula (1) in the present invention, a polyether structure represented by a general formula (2) is preferably contained as $Y^1$ or $Y^2$ at a content of 1 to 20 mol % based on 100 mol % of a total of $Y^1$ and $Y^2$.

[Chem. 4]

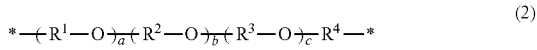

(2)

In the general formula (2), $R^1$ to $R^4$ each independently represent an alkylene group having 2 to 10 carbon atoms, a, b, and c represent an integer in the range of $1 \leq a \leq 20$, $0 \leq b \leq 20$, and $0 \leq c \leq 20$ respectively, and the sequence of the repeating units may be in a block manner or in a random manner. Furthermore, * represents a chemical bond in the general formula (2).

From the viewpoints of increasing the extensibility and reducing the elastic modulus in the cured film, the polyether structure represented by the general formula (2) is preferably contained at a content of 1 mol % or more, and more preferably 5 mol % or more based on 100 mol % of the total of $Y^1$ and $Y^2$ of the general formula (1). From the viewpoint of obtaining a cured film having high heat resistance, the polyether structure is preferably contained at a content of 20 mol % or less.

Specific examples of the diamine having the polyether structure include 1,2-bis(2-aminoethoxy)ethane, "JEFFAMINE" (registered trademark) HK-511, ED-600, ED-900, ED-2003, EDR-148, EDR-176, D-200, D-400, D-2000, and D-4000, and "ELASTAMINE" (registered trademark) RP-409, RP-2009, RT-1000, HT-1100, HE-1000, and HT-1700 (all manufactured by Huntsman International LLC.). Among these diamines, a tetramethylene ether group is preferable because an adhesion property to a metal after reliability can be imparted due to the excellent heat resistance of the tetramethylene ether. Examples of such a diamine include RT-1000, HE-1000, HT-1100, and HT-1700.

A cured film is easily obtained by heat treatment with the alkali-soluble resin (A) according to the present invention having a weight average molecular weight (Mw) of 3,000 or more in terms of polystyrene by gel permeation chromatography (GPC) in which a developing solvent contains 99.3% by mass of N-methyl-2-pyrrolidone, 0.2% by mass of lithium chloride, and 0.5% by mass of phosphoric acid, and in order to obtain a cured film having high extensibility and heat resistance, the weight average molecular weight is more preferably 10,000 or more, and still more preferably 30,000 or more. The alkali-soluble resin (A) having a weight average molecular weight of 200,000 or less can be processed as a photosensitive resin, and in order to obtain good pattern processability, the weight average molecular weight is more preferably 100,000 or less, and still more preferably 70,000 or less.

As the dicarboxylic acid, the dicarboxylic acid derivative, the acid dianhydride, and the diamine that can be used in the alkali-soluble resin (A) according to the present invention and are other than the above-described compounds, known compounds can be used.

Specific examples of the acid dianhydride include aromatic tetracarboxylic acid dianhydrides such as pyromellitic dianhydride, 3,3',4,4'-biphenyltetracarboxylic dianhydride, 3,3',4,4'-benzophenone tetracarboxylic dianhydride, bis(3,4-dicarboxyphenyl)sulfonic acid dianhydride, and 3,3',4,4'-diphenyl ether tetracarboxylic acid dianhydride, compounds produced by substituting an alkyl group or a halogen atom for the hydrogen atom in the above-described aromatic tetracarboxylic acid dianhydrides, and alicyclic tetracarboxylic acid dianhydrides and semi-alicyclic tetracarboxylic acid dianhydrides such as 1,2,3,4-cyclobutanetetracarboxylic dianhydride, 1,2,4,5-cyclohexanetetracarboxylic dianhydride, bicyclo[2.2.2]oct-7-ene-2,3,5,6-tetracarboxylic dianhydride, and 3,4-dicarboxy-1,2,3,4-tetrahydro-1-naphthalene succinic dianhydride, and are not limited thereto.

As the dicarboxylic acid, it is possible to use the same structure as the acid dianhydride residue of a polymer obtained from the above-described acid dianhydrides, and as the dicarboxylic acid derivative, it is possible to use a dicarboxylic acid having the following structure, or a compound produced by substituting the above-described active carboxylic acid group for the carboxylic acid group in these dicarboxylic acids.

[Chem. 5]

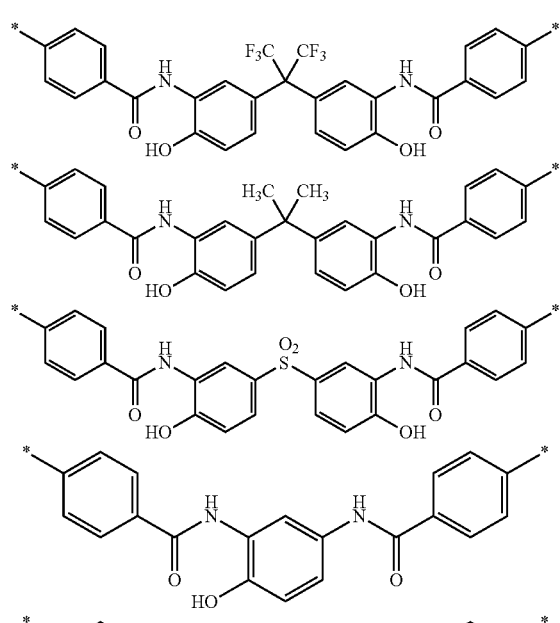

[Chem. 6]

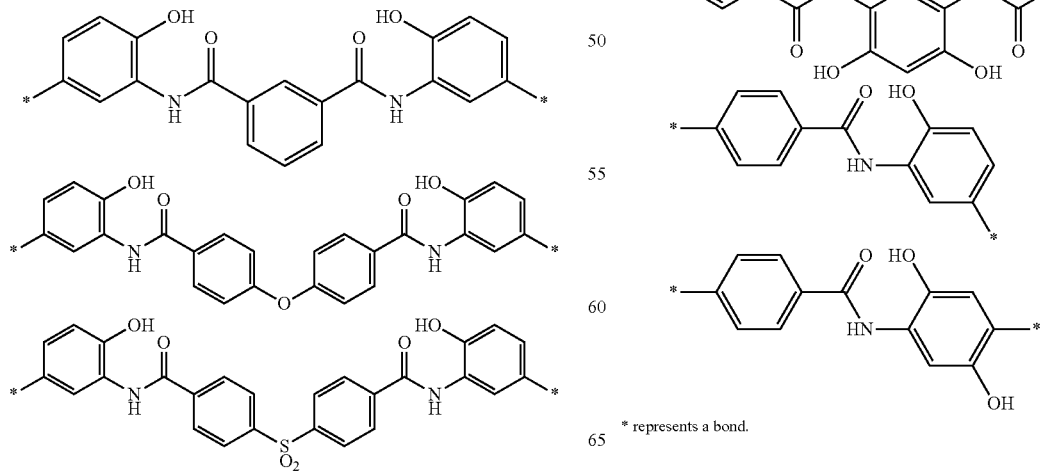

* represents a bond.

Specific examples of the diamine include hydroxy group-containing diamines such as bis(3-amino-4-hydroxyphenyl) propane and bis(3-amino-4-hydroxy)biphenyl, sulfonic acid-containing diamines such as 3-sulfonic acid -4,4'-diaminodiphenyl ether, thiol group-containing diamines such as dimercaptophenylenediamine, aromatic diamines having the structures shown below, compounds produced by substituting an alkyl group having 1 to 10 carbon atoms, a fluoroalkyl group, a halogen atom, or the like for some of the hydrogen atoms in these aromatic rings, and alicyclic diamines such as cyclohexyldiamine and methylenebiscyclohexylamine, and are not limited thereto. These diamines can be used as they are, as corresponding diisocyanate compounds, or as corresponding trimethylsilylated diamines. From the viewpoint of obtaining high alkali solubility, it is preferable to use the hydroxy group-containing diamine in an amount of 50 mol % or more among the total of the diamines.

[Chem. 7]

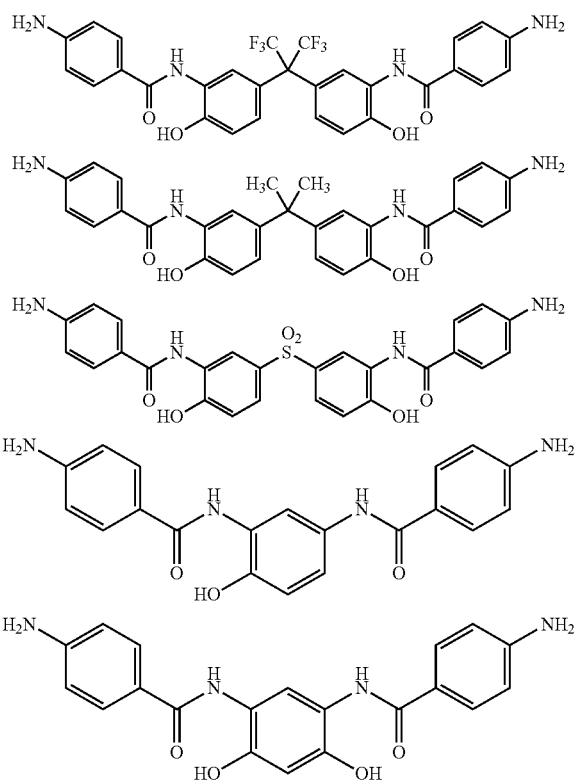

[Chem. 8]

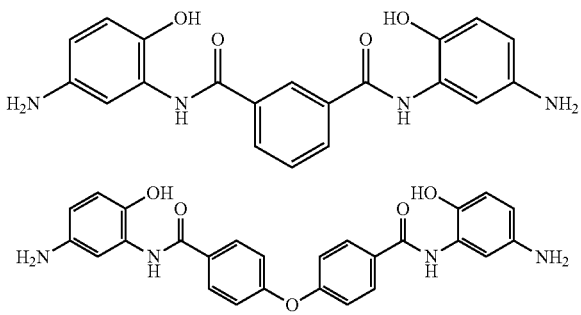

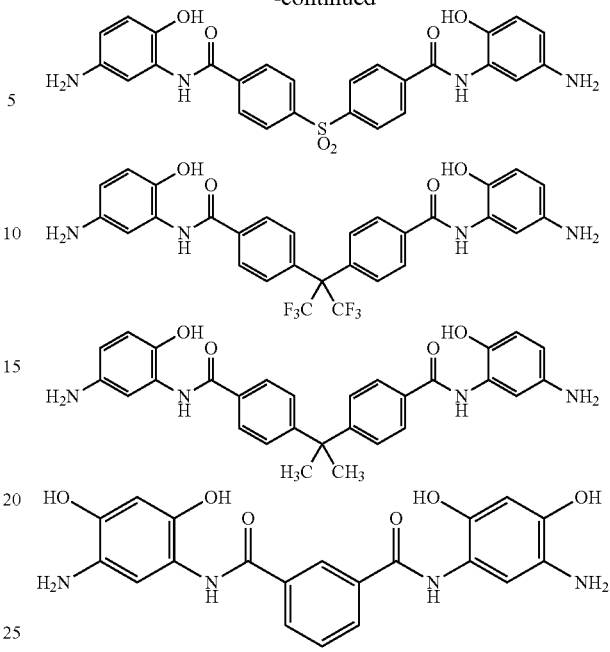

Furthermore, an aliphatic diamine having a siloxane structure may be copolymerized as long as the heat resistance is not deteriorated, and the adhesiveness to a silicon substrate can be improved. Specific examples of the copolymer include copolymers produced by copolymerizing bis(3-aminopropyl)tetramethyldisiloxane, bis(p-aminophenyl)octamethylpentasiloxane, or the like in an amount of 1 to 15 mol % based on all diamines.

The end of the main chain in the alkali-soluble resin (A) according to the present invention is preferably capped with an end cap compound such as a monoamine, an acid anhydride, a monocarboxylic acid, a monoacid chloride compound, or a mono-active ester compound. By capping the end, the storage stability in the case of use as a photosensitive resin composition can be improved. By capping the end with an end cap compound having a hydroxyl group, a carboxyl group, a sulfonic acid group, a thiol group, a vinyl group, an ethynyl group, or an allyl group, the dissolution rate of the alkali-soluble resin (A) in an alkali solution and the mechanical property of the obtained cured film can be easily adjusted to a preferable range in the case of use as a photosensitive resin composition. The proportion of the introduced end cap compound is preferably 0.1 to 50 mol % based on the total amine components, and because of the proportion in this range, the storage stability and the mechanical property can be improved without reducing the molecular weight of the resin.

As the monoamine, the acid anhydride, the monocarboxylic acid, the monoacid chloride compound, or the mono-active ester compound, a known compound can be used.

The end cap compound used in the present invention can be easily detected by the following method. For example, a resin into which the end cap compound is introduced is dissolved in an acidic solution, and decomposed into an amine component and an acid anhydride component that are the constituent units, and the constituent units are measured by gas chromatography (GC) or NMR to easily detect the end cap compound used in the present invention. Alternatively, the end cap compound can be easily detected by directly measuring the component of a resin into which the end cap compound is introduced by pyrolysis gas chromatography (PGC), infrared spectrum measurement, or $^{13}$C-NMR spectrum measurement.

The alkali-soluble resin (A) used in the present invention is synthesized by, for example, the following method, and examples of the method are not limited thereto.

First, a dicarboxylic acid or a compound in which a dicarboxylic acid is substituted with an active carboxylic acid group, and a diamine are dissolved in an organic solvent at room temperature and optionally at an elevated temperature, and then the solution was heated to polymerize the compounds. From the viewpoint of the stability of the solution during the reaction, the diamine compound having a high solubility is preferably first dissolved. After that, an acid dianhydride and optionally another copolymerization component are added, and an acid or an acid anhydride that serves as an end cap compound is added, and the components are polymerized.

In the case that a diamine having an aliphatic group is introduced, the reaction between the compound in which a dicarboxylic acid is substituted with an active carboxylic acid group and the diamine compound is preferably performed at 70 to 100° C.

The polyamide structure is derived from the dicarboxylic acid or the compound in which a dicarboxylic acid is substituted with an active carboxylic acid group in the above-described polymerization method.

The polyimide structure is derived from the acid dianhydride in the above-described polymerization method, and can be synthesized by a method in which a polyamic acid or a carboxylic acid is reacted with an esterifying agent during polymerization to obtain a polyamic acid ester structure, and the polyamic acid ester structure is dehydrated and cyclized in the reaction system to obtain a polyimide, a method in which a monomer having an imide structure is reacted, or a method in which a polyimide polymer is mixed to introduce an imide structure.

It is preferable that the alkali-soluble resin (A) used in the present invention be polymerized by the above-described method, then added to a large amount of water, a mixture of methanol and water, or the like, precipitated, then filtered, dried, and isolated. The drying temperature is preferably 40 to 100° C., and more preferably 50 to 80° C. By this operation, an unreacted monomer or oligomer component such as a dimer or a trimer is removed, and the film property after heat curing can be improved.

Examples of the organic solvent used for the polymerization of the alkali-soluble resin (A) include amides such as N,N-dimethylformamide, N,N-dimethylacetamide, N-methyl-2-pyrrolidone, 1,3-dimethyl-2-imidazolidinone, N,N'-dimethylpropyleneurea, N,N-dimethylisobutyric acid amide, N,N-dimethyllactamide, N,N-dimethylpropanamide, and methoxy-N,N-dimethylpropanamide, cyclic esters such as γ-butyrolactone, γ-valerolactone, δ-valerolactone, γ-caprolactone, ε-caprolactone, and α-methyl-γ-butyrolactone, carbonates such as ethylene carbonate and propylene carbonate, glycols such as triethylene glycol, phenols such as m-cresol and p-cresol, acetophenone, sulfolane, dimethylsulfoxide, tetrahydrofuran, dimethylsulfoxide, propylene glycol monomethyl ether acetate, and ethyl lactate, and are not limited thereto.

The alkali-soluble resin (A) according to the present invention can be used as a photosensitive resin composition by the mixing with a photosensitizer (B) and a solvent (C).

The photosensitive resin composition containing a photo acid generator as the photosensitizer (B) can be used as a positive photosensitive resin composition. The photosensitive resin composition containing a photopolymerizable compound and a photopolymerization initiator as a photosensitizer can be used as a negative photosensitive resin composition.

The positive photosensitive resin composition provides a higher resolution than the negative photosensitive resin composition, so that the former is more suitable for use in forming a fine working pattern than the latter.

The photo acid generator of the positive photosensitive resin composition preferably contains a quinonediazide compound. Examples of the quinonediazide compound include compounds in which a sulfonic acid of quinonediazide is ester-bonded to a polyhydroxy compound, compounds in which a sulfonic acid of quinonediazide is sulfonamide-bonded to a polyamino compound, and compounds in which a sulfonic acid of quinonediazide is ester-bonded and/or sulfonamide-bonded to a polyhydroxypolyamino compound. Not all the functional groups of these polyhydroxy compounds, polyamino compounds, and polyhydroxypolyamino compounds are required to be substituted with quinonediazide, and it is preferable that 40 mol % or more of all the functional groups on average be substituted with quinonediazide. Because of the photo acid generator containing such a quinonediazide compound, it is possible to obtain a positive photosensitive resin composition that is sensitive to i-line (wavelength: 365 nm), h-line (wavelength: 405 nm), and g-line (wavelength: 436 nm) from a mercury lamp that are general ultraviolet rays.

Specific examples of the polyhydroxy compound include Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, Methylene Tris-FR-CR, BisRS-26X, DML-MBPC, DML-MBOC, DML-OCHP, DML-PCHP, DML-PC, DML-PTBP, DML-34X, DML-EP, DML-POP, Dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (all trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (all trade names, manufactured by ASAHI YUKIZAI CORPORATION), 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, BisP-AP (trade name, manufactured by Honshu Chemical Industry Co., Ltd.), and novolac resins, and are not limited thereto.

Specific examples of the polyamino compound include 1,4-phenylenediamine, 1,3-phenylenediamine, 4,4'-diaminodiphenyl ether, 4,4'-diaminodiphenylmethane, 4,4'-diaminodiphenyl sulfone, and 4,4'-diaminodiphenyl sulfide, and are not limited thereto.

Specific examples of the polyhydroxypolyamino compound include 2,2-bis(3-amino-4-hydroxyphenyl)hexafluoropropane and 3,3'-dihydroxybenzidine, and are not limited thereto.

Among these compounds, examples of the quinonediazide compound preferably include esters of a phenol compound and a 4-naphthoquinonediazidesulfonyl group. As a result, high sensitivity and an enhanced resolution can be obtained in i-line exposure.

The content of the quinonediazide compound used in the photosensitive resin composition according to the present invention is preferably 1 to 50 parts by mass, and more preferably 10 to 40 parts by mass based on 100 parts by mass of the resin. The content of the quinonediazide compound is preferably in the above-described range because by setting the content to such a range, the contrast between the exposed portion and the unexposed portion is obtained to enhance the sensitivity. Furthermore, a sensitizer or the like may be added if necessary.

The photosensitive resin composition according to the present invention containing a photopolymerizable compound and a photopolymerization initiator as the photosensitizer (B) can be used as a negative photosensitive resin composition that is insolubilized by light. The photopolymerizable compound includes a polymerizable unsaturated functional group. Examples of the polymerizable unsaturated functional group include unsaturated double bond functional groups such as a vinyl group, an allyl group, an acryloyl group, and a methacryloyl group, and unsaturated triple bond functional groups such as propargyl. Among these groups, a group selected from a conjugated vinyl group, an acryloyl group, and a methacryloyl group is preferable from the viewpoint of polymerizability.

The number of the contained functional groups is preferably 1 to 4 from the viewpoint of the stability, and the contained groups are not required to be the same. The photopolymerizable compound preferably has a number average molecular weight of 30 to 800. In the case that the number average molecular weight is in the range of 30 to 800, the photopolymerizable compound has good compatibility with a polyamide, and the resin composition solution has good stability.

As the photopolymerizable compound, a known compound can be used. Examples of the photopolymerizable compound that can be particularly preferably used include 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, methylenebisacrylamide, N,N-dimethylacrylamide, N-methylolacrylamide, 2,2,6,6-tetramethylpiperidinyl acrylate, N-methyl-2,2,6,6-tetramethylpiperidinyl acrylate, ethylene oxide-modified bisphenol A diacrylate, ethylene oxide-modified bisphenol A dimethacrylate, N-vinylpyrrolidone, and N-vinylcaprolactam, and are not limited thereto.

The content of the photopolymerizable compound in the photosensitive resin composition according to the present invention is preferably 5 to 200 parts by mass, and, from the viewpoint of compatibility, more preferably 5 to 150 parts by mass based on 100 parts by mass of the resin. By setting the content of the photopolymerizable compound to 5 parts by mass or more, elution of the exposed portion during development can be prevented, and a resin composition having a high residual film rate after development can be obtained. By setting the content of the photopolymerizable compound to 200 parts by mass or less, film whitening during film-formation can be suppressed.

As the photopolymerization initiator in the case of using the photosensitive resin composition according to the present invention as a negative photosensitive resin composition, a known photopolymerization initiator can be used. Examples of the photopolymerization initiator include benzophenones such as benzophenone, Michler's ketone, and 4,4,-bis(diethylamino)benzophenone, benzylidenes such as 3,5-bis(diethylaminobenzylidene)-N-methyl -4-piperidone, coumarins such as 7-diethylamino-3-thenoylcoumarin, anthraquinones such as 2-t-butylanthraquinone, benzoins such as benzoin methyl ether, mercaptos such as ethylene glycol di(3-mercaptopropionate), glycines such as N-phenylglycine, oximes such as 1-phenyl -1,2-butanedione-2-(o-methoxycarbonyl)oxime, bis(α-isonitrosopropiophenoneoxime)isophthal, 1,2-octanedione-1-[4-(phenylthio)phenyl]-2-(o-benzoyloxime), OXE02 (trade name, manufactured by Ciba Specialty Chemicals, Inc.), and NCI-831 (trade name, manufactured by ADEKA Corporation), and α-aminoalkylphenones such as 2-benzyl-2-dimethylamino -1-(4-morpholinophenyl)-butane-1-2-methyl-1[4-(methylthio)phenyl]-2-morpholinopropan-1-one. Among these photopolymerization initiators, the above-described oximes are preferable, and 1-phenyl-1,2-propanedione-2-(o-ethoxycarbonyl)oxime, 1-phenyl-1,2-propanedione-2-(o-benzoyl)oxime, bis(α-isonitrosopropiophenoneoxime) isophthal, 1,2-octanedione-1-[4-(phenylthio)phenyl]-2-(o-benzoyloxime), OXE02, and NCI-831 are particularly preferable. These photopolymerization initiators are used singly or in combination of two or more of them.

Among the photopolymerization initiators, a combination selected from the above-described benzophenones, glycines, mercaptos, oximes, α-aminoalkylphenones, and 2,2'-bis(o-chlorophenyl)-4,4',5,5'-tetraphenyl biimidazole is preferable from the viewpoint of photoreaction.

The content of the photopolymerization initiator is preferably 0.1 to 60 parts by mass, and more preferably 0.2 to 40 parts by mass based on 100 parts by mass of the total of the alkali-soluble resin (A). The content of 0.1 parts by mass or more is preferable because in the case of such a content, radicals are sufficiently generated by light irradiation to improve the sensitivity, and in the case that the content is 60 parts by mass or less, radicals are excessively generated to improve the alkali developability without curing of the unirradiated portion.

The photosensitive resin composition according to the present invention contains the solvent (C). Examples of the solvent include aprotic polar solvents such as N-methyl -2-pyrrolidone, γ-butyrolactone, γ-valerolactone, δ-valerolactone, N,N-dimethylformamide, N,N-dimethylacetamide, dimethyl sulfoxide, 1,3-dimethyl-2-imidazolidinone, N,N'-dimethylpropyleneurea, and N,N-dimethyllactamide, ethers such as tetrahydrofuran, dioxane, propylene glycol monomethyl ether, propylene glycol monoethyl ether, and diethylene glycol monoethyl ether, ketones such as acetone, methyl ethyl ketone, and diisobutyl ketone, esters such as ethyl acetate, butyl acetate, isobutyl acetate, propyl acetate, propylene glycol monomethyl ether acetate, and 3-methyl-3-methoxybutyl acetate, alcohols such as ethyl lactate, methyl lactate, diacetone alcohol, and 3-methyl-3-methoxybutanol, and aromatic hydrocarbons such as toluene and xylene. Two or more of these solvents may be contained.

The content of the solvent (C) is, based on 100 parts by mass of the alkali-soluble resin (A), preferably 100 parts by mass or more in order to dissolve the composition, and preferably 1,500 parts by mass or less in order to form a coating film having a thickness of 1 µm or more.

In the photosensitive resin composition according to the present invention, a compound (D) having a boiling point of 150 to 250° C. and a melting point of −30° C. or less is preferably contained among the solvent (C). The compound (D) preferably has a molecular weight of 100 or more. Because the melting point is −30° C. or less, the mechanical property of the cured film at the freezing point or less is improved, and the resistance in the thermal cycle test in the reliability test of a semiconductor device or the like can be improved. The melting point is more preferably −45° C. or less in order to further improve the resistance in the reliability test. Because the boiling point is 150 to 250° C., the compound (D) remains in the cured film after the heat treatment without deteriorating the heat resistance and the chemical resistance, so that the mechanical property of the cured film can be improved at low temperature. The molecular weight is preferably 100 or more from the viewpoint of the remaining in the cured film after the heat treatment.

That is, as the compound (D), a compound (D-1) having a boiling point of 150 to 250° C., a melting point of more than −45° C. and −30° C. or less, and a molecular weight of 100 or more is preferable, and a compound (D-2) having a boiling point of 150 to 250° C., a melting point of −45° C. or less, and a molecular weight of 100 or more is more preferable.

From the viewpoint of obtaining the effect of improving the mechanical property of the cured film at low temperature, the compound (D) is preferably contained at a content of 0.1 parts by mass or more, and more preferably 10 parts by mass or more among 100 parts by mass of the solvent (C). From the viewpoint of obtaining a good coating property and a high residual film rate after development, the compound (D) is preferably contained at a content of 50 parts by mass or less, and more preferably 30 parts by mass or less among 100 parts by mass of the solvent (C).

The content of the compound (D) in the cured film after the heat treatment is preferably 0.05 to 5,000 ppm. Because the content is 0.05 ppm or more, the effect of improving the mechanical property of the cured film at low temperature can be obtained, and the content is more preferably 0.1 ppm or more. Because the content of the compound (D) in the cured film is 5,000 ppm or less, good heat resistance can be obtained.

Specific examples of the compound (D-1) include diacetone alcohol (boiling point: 167° C., melting point: −44° C., molecular weight: 116.16) and N,N-dimethylisobutyramide (boiling point: 176° C., melting point: −34° C., molecular weight: 115.18). Among these compounds, N,N-dimethylisobutyramide is particularly preferable.

Specific examples of the compound (D-2) include isopropylcyclohexane (boiling point: 155° C., melting point: −89° C., molecular weight: 126.24), N-ethylaniline (boiling point: 206° C., melting point: −64° C., molecular weight: 121.18), meta-ethyltoluene (boiling point: 161° C., melting point: −96° C., molecular weight: 120.19), para-ethyltoluene (boiling point: 162° C., melting point: −62° C., molecular weight: 120.19), 3-methoxytoluene (boiling point: 177° C., melting point: −56° C., molecular weight: 122.16), hexyl acetate (boiling point: 171° C., melting point: −81° C., molecular weight: 144.21), benzyl acetate (boiling point: 215° C., melting point: −52° C., molecular weight: 150.18), ethylene glycol monobutyl ether (boiling point: 171° C., melting point: −70° C., molecular weight: 118.18), ethylene glycol monoethyl ether acetate (boiling point: 156° C., melting point: −62° C., molecular weight: 132.16), ethylene glycol monobutyl ether acetate (boiling point: 192° C., melting point: −64° C., molecular weight: 160.21), diethylene glycol ethyl methyl ether (boiling point: 176° C., melting point: −72° C., molecular weight: 148.21), diethylene glycol monomethyl ether (boiling point: 193° C., melting point: −70° C., molecular weight: 120.20), diethylene glycol monobutyl ether (boiling point: 231° C., melting point: −68° C., molecular weight: 162.23), ethyl 3-ethoxypropionate (boiling point: 166° C., melting point: −75° C., molecular weight: 146.19), N,N-dimethylorthotoluidine (boiling point: 185° C., melting point: −61° C., molecular weight: 135.21), N,N-dimethylpropanamide (boiling point: 174° C., melting point: −45° C., molecular weight: 101.15), 3-methoxy-N,N-dimethylpropanamide (boiling point: 215° C., melting point: −49° C., molecular weight: 131.17), 2-ethyl-1-hexanol (boiling point: 183° C., melting point: −76° C., molecular weight: 130.23), 1-hexanol (boiling point: 157° C., melting point: −52° C., molecular weight: 102.17), nonane (boiling point: 151° C., melting point: −54° C., molecular weight: 128.26), 3-methylcyclohexanone (boiling point: 170° C., melting point: −74° C., molecular weight: 112.17), ethyl hexanoate (boiling point: 168° C., melting point: −68° C., molecular weight: 144.21), ethyl heptanoate (boiling point: 186° C., melting point: −66° C., molecular weight: 158.24), dimethyl malonate (boiling point: 181° C., melting point: −62° C., molecular weight: 132.12), diethyl malonate (boiling point: 199° C., melting point: −51° C., molecular weight: 160.17), and 3-methylcyclohexanone (boiling point: 169° C., melting point: −74° C., molecular weight: 112.17). Among these compounds, from the viewpoints of a high effect of improving the mechanical property and of a good coating property, diethylene glycol monobutyl ether (boiling point: 231° C., melting point: −68° C., molecular weight: 162.23), N,N-dimethylpropanamide (boiling point: 174° C., melting point: −45° C., molecular weight: 101.15), and 3-methoxy-N,N-dimethylpropanamide (boiling point: 215° C., melting point: −49° C., molecular weight: 131.17) are preferable.

The photosensitive resin composition according to the present invention may contain an additive described below in addition to the alkali-soluble resin (A), the photosensitizer (B), and the solvent (C).

Because the photosensitive resin composition contains an antioxidant as the additive, it is possible to improve the extensibility property of the cured film after the reliability evaluation and the adhesion property to a metal material. Examples of the antioxidant include compounds represented by the general formula (3).

[Chem. 9]

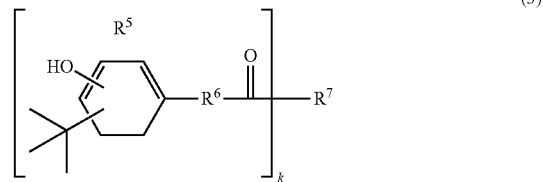

(3)

In the general formula (3), $R^5$ represents a hydrogen atom or an alkyl group having 2 or more carbon atoms, and $R^6$ represents an alkylene group having 2 or more carbon atoms. $R^7$ represents a monovalent to tetravalent organic group including at least one of an alkylene group having 2 or more carbon atoms, an O atom, or an N atom. k represents an integer of 1 to 4.

The compound represented by the general formula (3) suppresses the oxidative deterioration of the aliphatic group and the phenolic hydroxyl group of the alkali-soluble resin (A). Furthermore, the compound can suppress metal oxidation by the rust preventing action on a metal material.

k is more preferably an integer of 2 to 4 so that the compound can act on the alkali-soluble resin (A) and a metal material simultaneously. $R^7$ is an alkyl group, a cycloalkyl group, an alkoxy group, an alkyl ether group, an alkylsilyl group, an alkoxysilyl group, an aryl group, an aryl ether group, a carboxyl group, a carbonyl group, an allyl group, a vinyl group, a heterocyclic group, —O—, —NH—, —NHNH—, a combination thereof, or the like, and may further have a substituent. Among these groups, an alkyl ether and —NH— are preferable from the viewpoints of solubility in a developing solution and of an adhesion property to a metal, and —NH— is more preferable from the viewpoint of an adhesion property to a metal due to an interaction with a resin and metal complex formation.
Examples of the compound represented by the general formula (3) include compounds having the following structures, but are not limited thereto.
[Chem. 10]
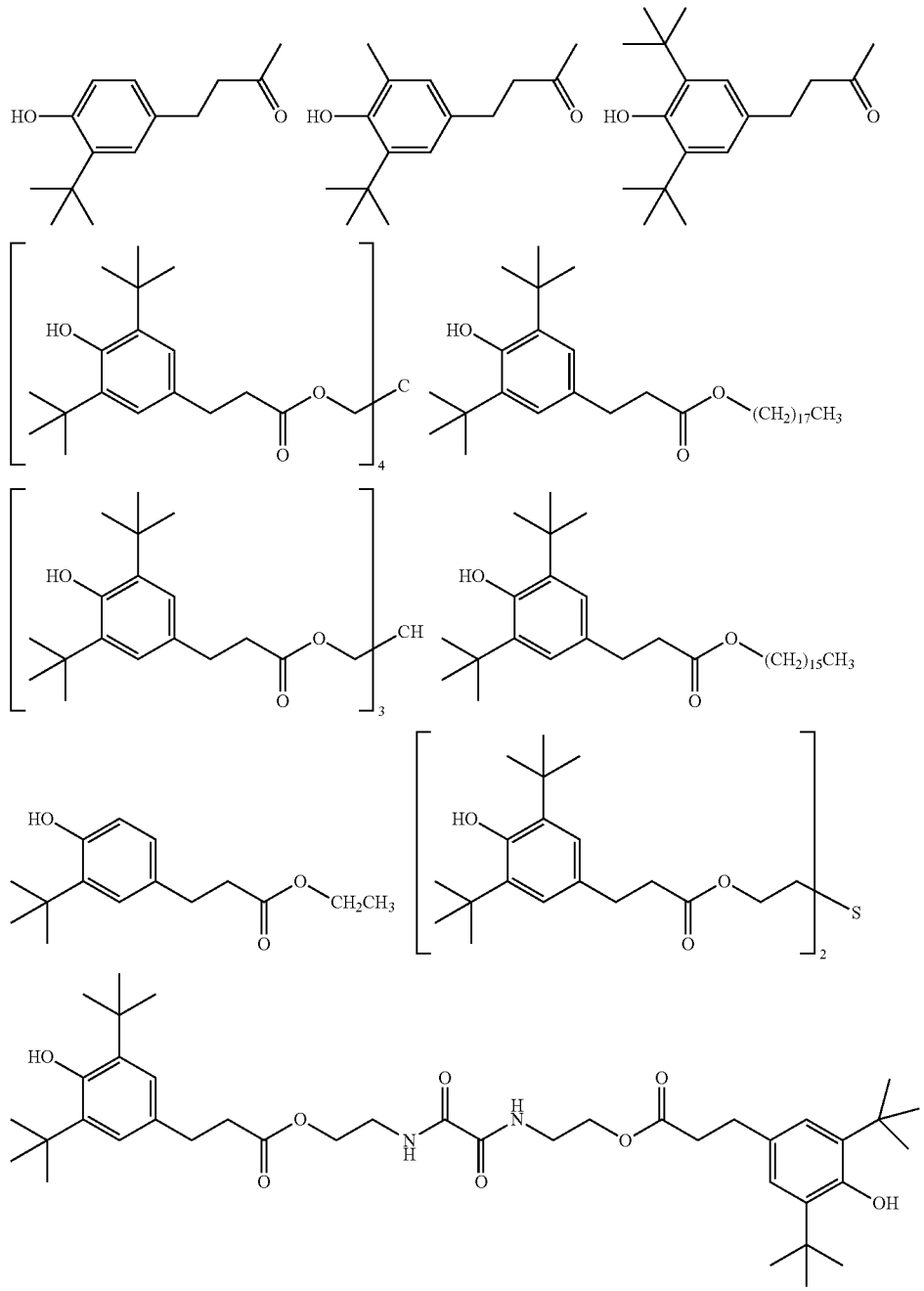
[Chem. 11]
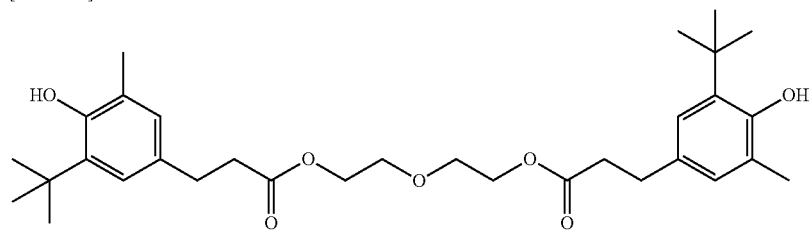

-continued
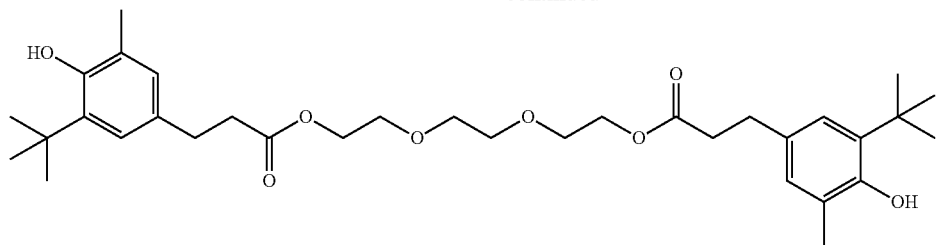
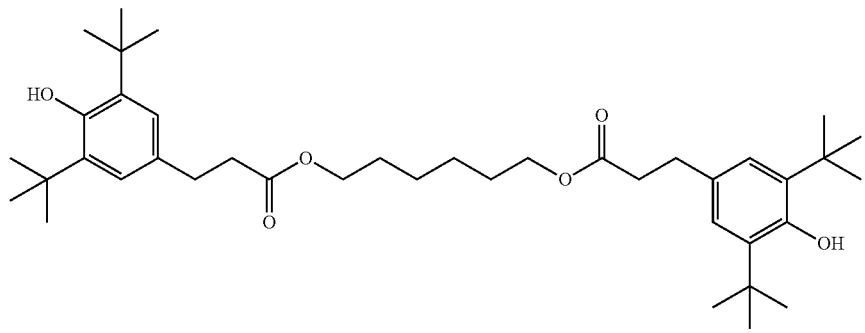
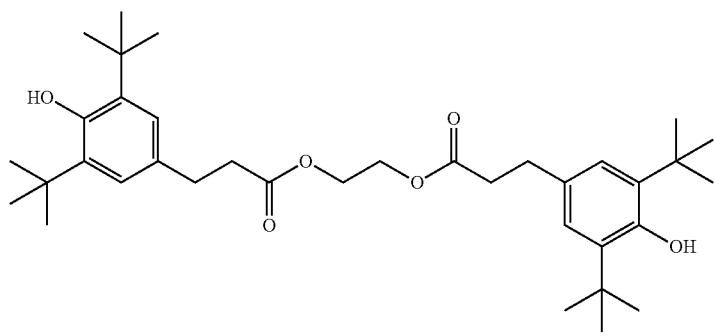
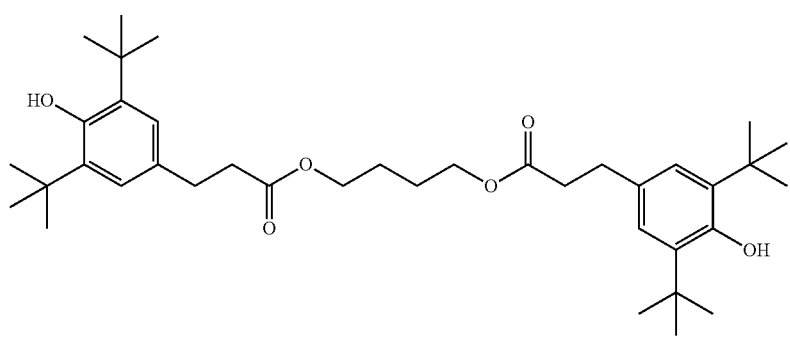
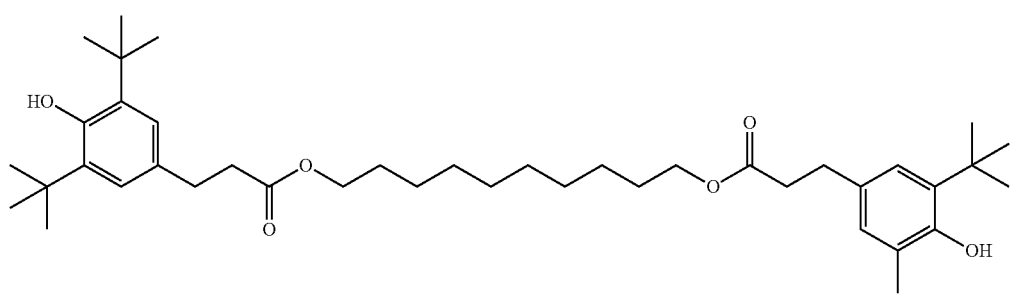

[Chem. 12]
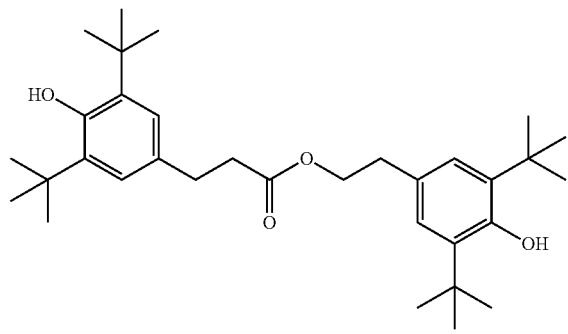
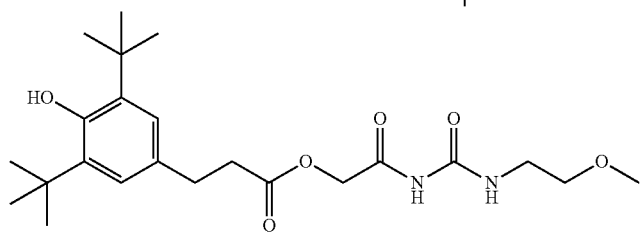
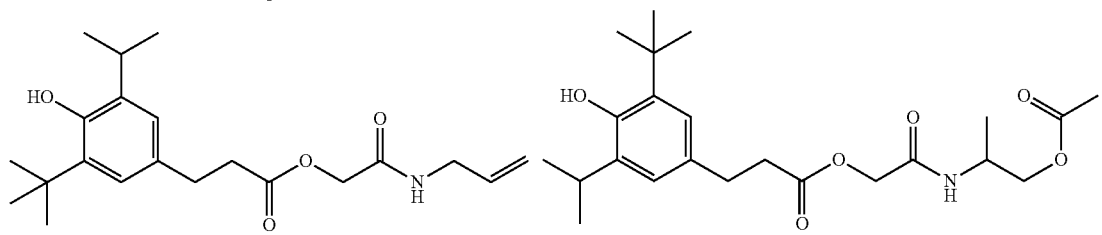
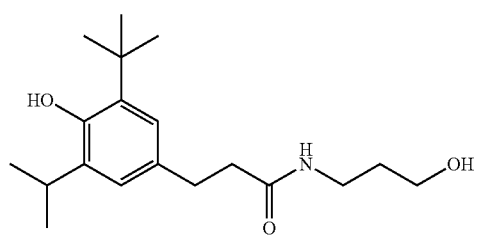
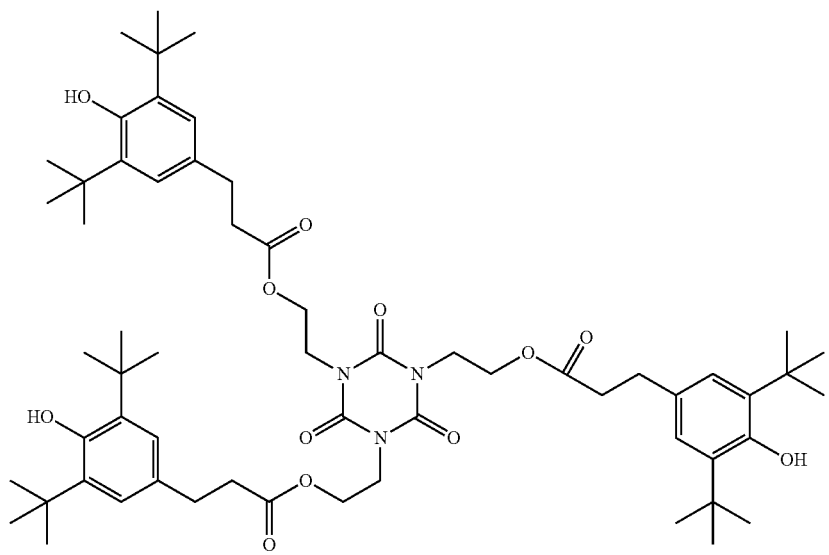

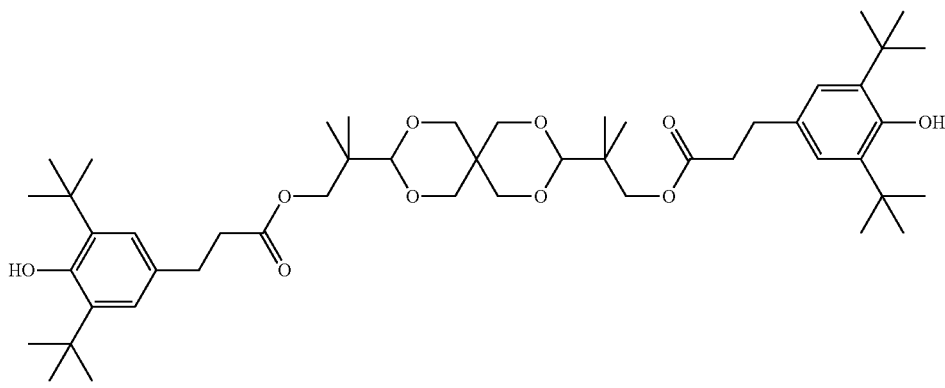
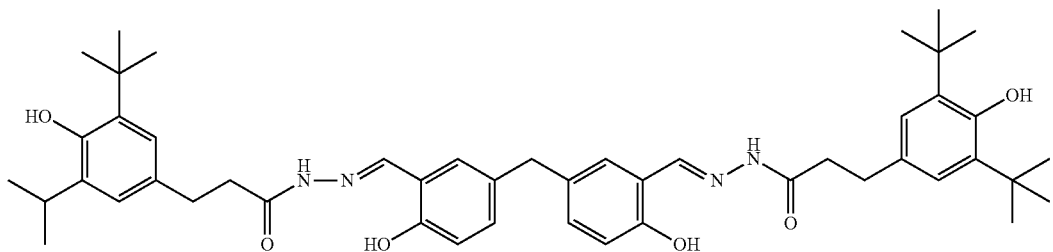
[Chem. 13]
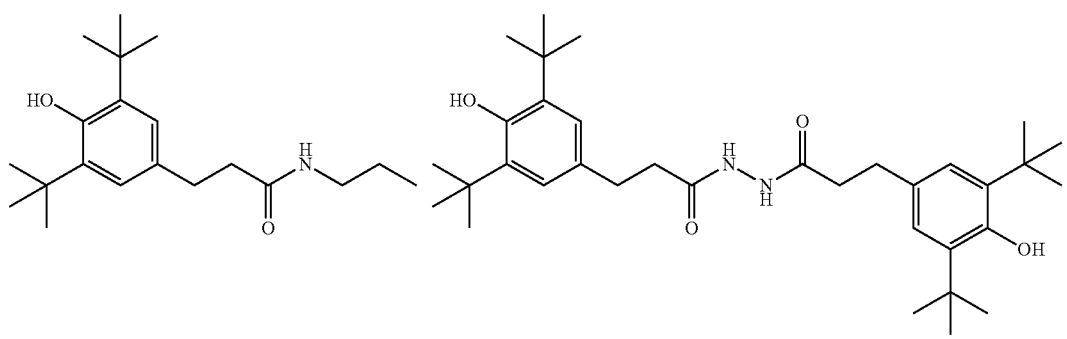
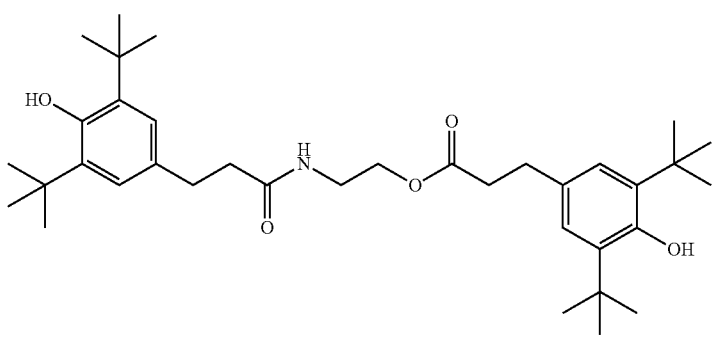
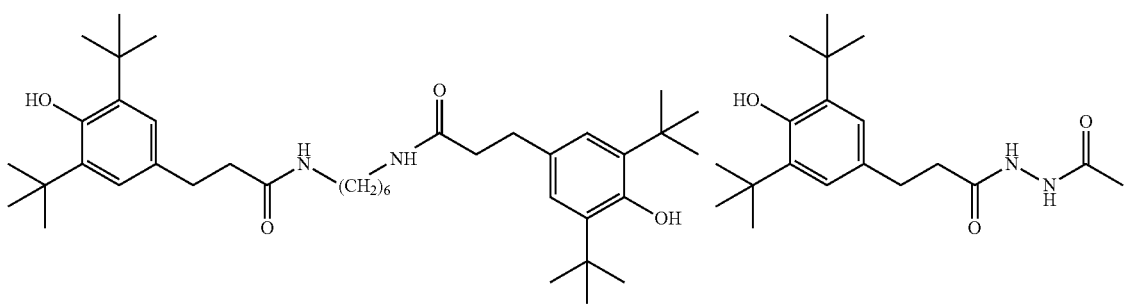

-continued
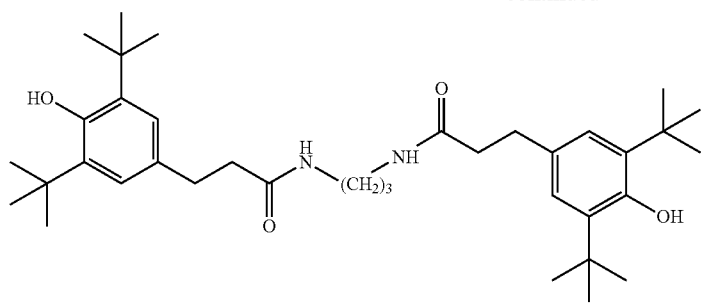
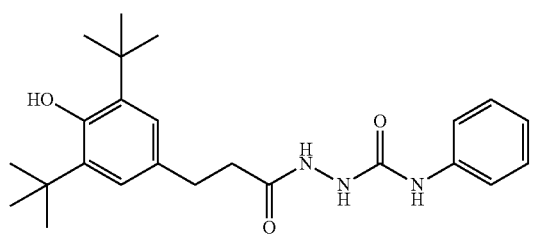
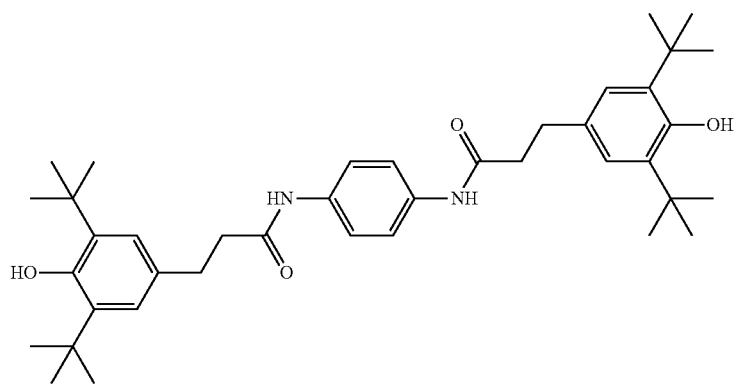
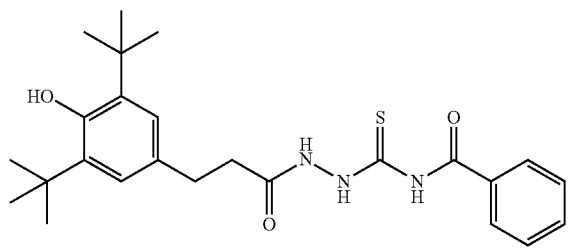
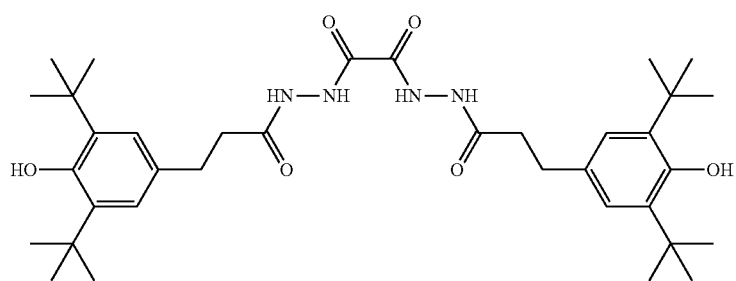
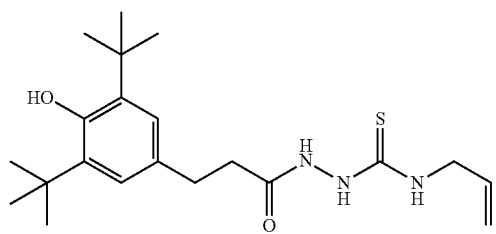

The addition amount of the compound represented by the general formula (3) is preferably 0.1 to 10 parts by mass, and more preferably 0.5 to 5 parts by mass based on the alkali-soluble resin (A). If the addition amount is less than 0.1 parts by mass, it is difficult to obtain the effect of improving the extensibility property and the adhesion property to a metal material after the reliability, and if the addition amount is more than 10 parts by mass, there is a possibility that the sensitivity of the resin composition will be deteriorated owing to the interaction with the photosensitizer.

In the photosensitive resin composition according to the present invention containing a thermal crosslinking agent as the additive, the extensibility can be further improved and the stress can be further reduced. Examples of the thermal crosslinking agent include compounds represented by the general formula (4).

Because the thermal crosslinking agent itself has a flexible alkylene group and a rigid aromatic group, the extensibility can be improved and the stress can be reduced while the heat resistance is kept. Examples of the crosslinking group include an acrylic group, a methylol group, an alkoxymethyl group, and an epoxy group, and are not limited thereto. Among these groups, an epoxy group is preferable because it reacts with the phenolic hydroxyl group of the resin to improve the heat resistance of the cured film and because it can react without dehydration.

Examples of the compound represented by the general formula (4) include compounds having the following structures, but are not limited thereto.

[Chem. 15]

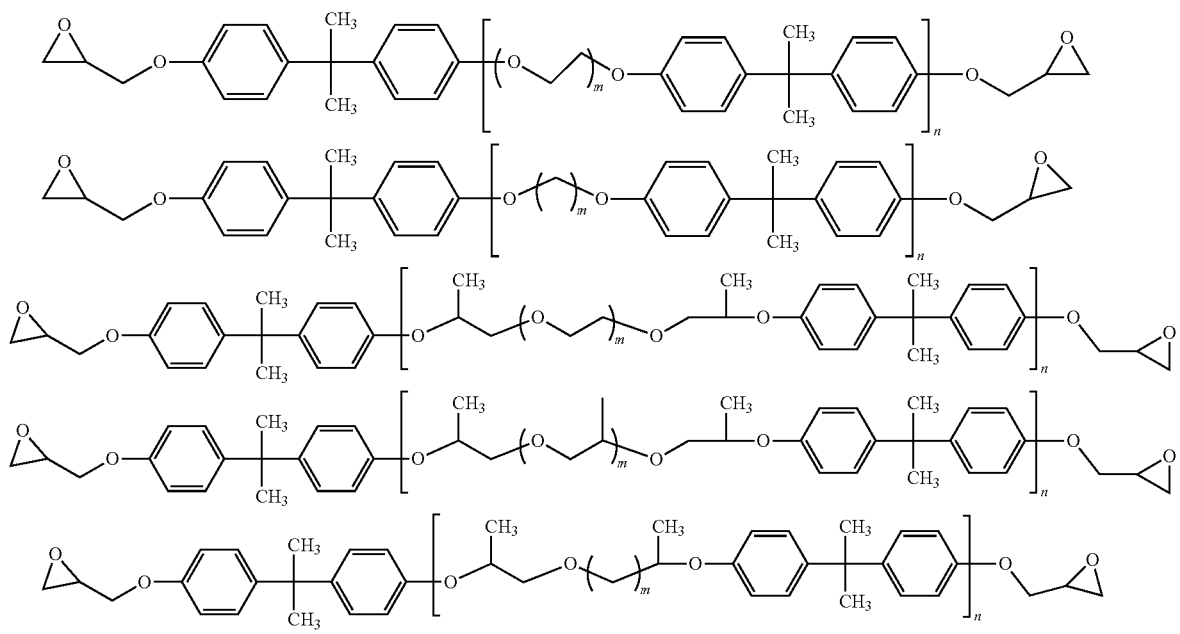

[Chem. 14]

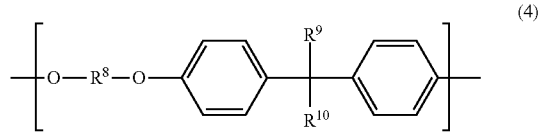

In the general formula (4), $R^9$ and $R^{10}$ each independently represent a hydrogen atom or a methyl group. $R^8$ is a divalent organic group having an alkylene group having 2 or more carbon atoms, and may be linear, branched, or cyclic.

$R^8$ is an alkyl group, a cycloalkyl group, an alkoxy group, an alkyl ether group, an alkylsilyl group, an alkoxysilyl group, an aryl group, an aryl ether group, a carboxyl group, a carbonyl group, an allyl group, a vinyl group, a heterocyclic group, a combination thereof, or the like, and may further have a substituent.

In the formula, n is an integer of 1 to 5, and m is an integer of 1 to 20.

Among the above-described structures, the structures in which n is 1 to 2 and m is 3 to 7 are preferable from the viewpoint of achieving both heat resistance and improvement in extensibility.

The addition amount of the compound represented by the general formula (4) is preferably 2 to 35 parts by mass, and more preferably 5 to 25 parts by mass based on the alkali-soluble resin (A). If the addition amount is less than 5 parts by mass, it is difficult to obtain the effects of improving the extensibility and reducing the stress, and if the addition amount is more than 35 parts by mass, there is a possibility that the sensitivity of the resin composition will be deteriorated.

The photosensitive resin composition according to the present invention may contain a thermal crosslinking agent other than the above-described agents. Specifically, a compound having at least two alkoxymethyl groups or methylol groups is preferable. By having the at least two groups, the compound can form a crosslinked structure through the condensation reaction with a resin and the same kind of molecule. By using the compound in combination with the photo acid generator or the photopolymerization initiator, designs can be made in a further wide range to improve the sensitivity and the mechanical property of the cured film.

Preferable examples of the compound include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all trade names, manufactured by Honshu Chemical Industry Co., Ltd.), NIKALAC (registered trademark) MX-290, NIKALAC MX-280, NIKALAC MX-270, NIKALAC MX-279, NIKALAC MW-100LM, and NIKALAC MX-750LM (all trade names, manufactured by SANWA Chemical Co., Ltd.). Two or more of these compounds may be contained. Among these compounds, HMOM-TPHAP and MW-100LM are more preferable because when HMOM-TPHAP and MW-100LM are added, reflow during curing rarely occurs, and the pattern is high rectangular.

As the additive of the photosensitive resin composition according to the present invention, a low molecular weight compound having a phenolic hydroxyl group may be contained. Because the low molecular weight compound having a phenolic hydroxyl group is contained, the developing time can be shortened.

Examples of the compound include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, Methylene Tris-FR-CR, and BisRS-26X (all trade names, manufactured by Honshu Chemical Industry Co., Ltd.), BIP-PC, BIR-PC, BIR-PTBP, and BIR-BIPC-F (all trade names, manufactured by ASAHI YUKIZAI CORPORATION). Two or more of these compounds may be contained.

The content of the low molecular weight compound having a phenolic hydroxyl group is preferably 1 part by mass or more based on 100 parts by mass of the resin because, owing to such a content, the effect of shortening the developing time is obtained, and the content is preferably 40 parts by mass or less because, owing to such a content, the residual film rate after shrinkage is not reduced after curing.

In the photosensitive resin composition according to the present invention containing, as the additive, a surfactant, an ester such as ethyl lactate or propylene glycol monomethyl ether acetate, an alcohol such as ethanol, a ketone such as cyclohexanone or methyl isobutyl ketone, or an ether such as tetrahydrofuran or dioxane, the wettability on a substrate can be improved.

In order to improve the adhesiveness to a substrate, the photosensitive resin composition according to the present invention may contain, as a silicon component, a silane coupling agent such as trimethoxyaminopropylsilane, trimethoxyepoxysilane, trimethoxyvinylsilane, or trimethoxythiolpropylsilane as long as the storage stability is not impaired. The preferable content of the silane coupling agent is 0.01 to 5 parts by mass based on 100 parts by mass of the polyamide resin component.

The photosensitive resin composition according to the present invention may contain another alkali-soluble resin as long as the properties such as high extensibility, high adhesion property, low elasticity, reduced stress, and high heat resistance are not deteriorated. Specific examples of another alkali-soluble resin include polyimide precursors, polyimide resins, polybenzoxazole, polybenzoxazole precursors, polyamide resins, siloxane resins, acrylic polymers produced by copolymerizing acrylic acids, novolac resins, resole resins, polyhydroxystyrene resins, modified products produced by introducing a crosslinking group such as a methylol group, an alkoxymethyl group, or an epoxy group into the above-described resins, and copolymers thereof. Such a resin is soluble in a solution of an alkali such as tetramethylammonium hydroxide, choline, triethylamine, dimethylaminopyridine, monoethanolamine, diethylaminoethanol, sodium hydroxide, potassium hydroxide, or sodium carbonate. Because such an alkali-soluble resin is contained, the property of each alkali-soluble resin can be provided while the adhesion property and the excellent sensitivity of the cured film are maintained.

Among these resins, phenol resins such as novolac resins, resole resins, polyhydroxystyrene resins, and modified products produced by introducing a crosslinking group such as a methylol group, an alkoxymethyl group, or an epoxy group into the above-described resins are preferable because the sensitivity is improved and, owing to the low change rate in shrinkage before and after curing of such a resin, the stress can be reduced.

The content of such a resin is preferably 5 to 200 parts by mass, and more preferably 15 to 150 parts by mass based on 100 parts by mass of the alkali-soluble resin (A) according to the present invention.

The viscosity of the photosensitive resin composition according to the present invention is preferably 2 to 5,000 mPa·s. The viscosity can be measured using an E type rotational viscometer. By adjusting the solid content concentration so that the viscosity is 2 mPa·s or more, a desired film thickness is easily obtained. If the viscosity is 5,000 mPa·s or less, a coating film having high uniformity is easily obtained. The photosensitive resin composition having such a viscosity can be easily obtained by, for example, setting the solid content concentration to 5 to 60% by mass.

Next, a method for forming a relief pattern of a cured film using the photosensitive resin composition according to the present invention will be described.

First, the photosensitive resin composition according to the present invention is applied to a substrate. Examples of the substrate include silicon wafers, ceramics, gallium arsenide, organic circuit substrates, inorganic circuit substrates, composite substrates of a silicon wafer and a sealing resin such as an epoxy resin, and substrates produced by placing a circuit constituent material on the above-described substrates, and are not limited thereto. Examples of the organic circuit substrate include glass substrate copper-clad laminate sheets such as glass fabric/epoxy copper-clad laminate sheets, composite copper-clad laminate sheets such as glass nonwoven fabric/epoxy copper-clad laminate sheets, heat resistant/thermoplastic substrates such as temporary adhesive carrier substrates, polyetherimide resin substrates, polyether ketone resin substrates, and polysulfone-based resin substrates, and flexible substrates such as polyester copper-clad film substrates and polyimide copper-clad film substrates. Examples of the inorganic circuit substrate include ceramic substrates such as glass substrates, alumina substrates, aluminum nitride substrates, and silicon carbide substrates, and metal-based substrates such as aluminum-based substrates and iron-based substrates. Examples of the circuit constituent material include conductors including a metal such as silver, gold, or copper, resistors including an inorganic oxide or the like, low dielectric materials including a glass-based material and/or a resin, or the like, high dielectric materials including a resin, a high dielectric inorganic particle, or the like, and insulators including a glass-based material or the like. Examples of the method of the application include spin coating using a spinner, spray coating, roll coating, screen printing, and methods in which a blade coater, a die coater, a calendar coater, a meniscus coater, a bar coater, a roll coater, a comma roll coater, a gravure coater, a screen coater, or a slit die coater is used. The coating film is usually formed so that the thickness of the dried film is 0.1 to 150 μm although the thickness depends on the coating technique, the solid content concentration of the composition, the viscosity, and the like.

In the case that the photosensitive resin composition according to the present invention is used as a photosensitive sheet, the photosensitive resin composition is applied to a base material, and the organic solvent is removed to produce a photosensitive sheet.

As the base material to which the photosensitive resin composition is applied, polyethylene terephthalate (PET) or the like can be used. When the PET film as a base material needs to be peeled off in the case of use of the photosensitive sheet attached to a substrate such as a silicon wafer, a PET film whose surface is coated with a release agent such as a silicone resin is preferably used to easily peel the PET film off the photosensitive sheet.

As a method of applying the photosensitive resin composition to a PET film, screen printing or a method in which a spray coater, a bar coater, a blade coater, a die coater, a spin coater, or the like is used can be used. Examples of the method of removing the organic solvent include heating with an oven or a hot plate, vacuum drying, and heating with electromagnetic waves such as infrared rays and microwaves. If the organic solvent is insufficiently removed, there is a possibility that a cured product obtained by subsequent curing treatment will be uncured or have a poor thermomechanical property. The thickness of the PET film is not particularly limited, and is preferably in the range of 30 to 80 μm from the viewpoint of workability. In order to protect the surface of the photosensitive sheet from dust and the like in the atmosphere, a cover film may be attached to the surface of the photosensitive sheet. If a photosensitive sheet having a desired thickness cannot be prepared because of the low solid content concentration of the photosensitive resin composition, two or more photosensitive sheets may be attached to each other after removal of the organic solvent.

When the photosensitive sheet produced by the above-described method is attached to another substrate, the photosensitive sheet may be attached using a laminating device such as a roll laminator or a vacuum laminator, or may be manually attached, using a rubber roller, to a substrate heated on a hot plate. After the attachment to the substrate, the resulting product is sufficiently cooled, and then the PET film is peeled off.

In order to enhance the adhesiveness between the substrate such as a silicon wafer and the photosensitive resin composition, the substrate can be pretreated with the above-described silane coupling agent. For example, the surface of the substrate is treated with a solution prepared by dissolving 0.5 to 20% by mass of the silane coupling agent in a solvent such as isopropanol, ethanol, methanol, water, tetrahydrofuran, propylene glycol monomethyl ether acetate, propylene glycol monomethyl ether, ethyl lactate, or diethyl adipate by spin coating, dipping, spray coating, steam treatment, or the like. In some cases, heat treatment is then performed at 50° C. to 300° C. to promote the reaction between the substrate and the silane coupling agent. Next, the photosensitive resin composition is applied to the substrate, or the substrate laminated with the photosensitive sheet is dried to obtain a photosensitive resin composition film. The drying is preferably performed using an oven, a hot plate, infrared rays, or the like in the range of 50° C. to 150° C. for 1 minute to several hours.

Next, the photosensitive resin composition film is irradiated with and exposed to an actinic ray through a mask having a desired pattern. Examples of the actinic ray used for the exposure include ultraviolet rays, visible rays, electron rays, and X-rays, and in the present invention, i-line (365 nm), h-line (405 nm), or g-line (436 nm) from a mercury lamp is preferably used.

In order to form a pattern, after the exposure, the exposed portion is removed in the case of the positive photosensitive resin composition, and the unexposed portion is removed in the case of the negative photosensitive resin composition using a developing solution. As the developing solution, a solution of an alkaline compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine is preferable. In some cases, to the alkaline solution, a polar solvent such as N-methyl-2-pyrrolidone, N,N-dimethylformamide, N,N-dimethylacetamide, dimethylsulfoxide, γ-butyrolactone, or dimethylacrylamide, an alcohol such as methanol, ethanol, or isopropanol, an ester such as ethyl lactate or propylene glycol monomethyl ether acetate, a ketone such as cyclopentanone, cyclohexanone, isobutyl ketone, or methyl isobutyl ketone, or the like may be added singly or in combination of several kinds thereof. The development can be performed by a method of spraying the above-described developing solution on the film face, immersing in the developing solution, applying ultrasonic waves during immersing, spraying the developing solution on the rotating substrate, or the like. After the development, a rinse treatment is preferably performed with water. Here, also to the water, an alcohol such as ethanol or isopropyl alcohol, an ester such as ethyl lactate or propylene glycol monomethyl ether acetate, or the like may be added to perform the rinse treatment.

After the development, a thermal crosslinking reaction is promoted by heat treatment at a temperature of 150° C. to 500° C. The term "cured film" in the present invention refers to a film subjected to the heat treatment. The heat resistance and the chemical resistance can be improved by the crosslinking. As the method of the heat treatment, a method can be selected in which the temperature is raised stepwise to a selected temperature value, or in which the temperature is continuously raised for 5 minutes to 5 hours in a selected temperature range. An example of the former method is a method in which heat treatment is performed at 130° C. for 30 minutes and at 200° C. for 30 minutes. An example of the latter method is a method in which the temperature is linearly raised from room temperature to 400° C. over 2 hours. The curing condition in the present invention is preferably 150° C. or more and 350° C. or less, and more preferably 150° C. or more and 230° C. or less so that the present invention provides an excellent cured film especially at low temperature curing.

In the cured film obtained by the above-described method of the heat treatment of the photosensitive resin composition or the photosensitive sheet according to the present invention at a temperature of 200° C., in the case that the alkali-soluble resin (A) contains a polyhydroxyamide having a polybenzoxazole precursor structure, the ring closure rate of the benzoxazole precursor structure of the polyhydroxyamide is preferably 0 to 60%, and more preferably 0 to 20% from the viewpoint of reducing stress. The cured film having low stress can be obtained because the ring closure rate is within the above-described range.

The ring closure rate is calculated as follows. The photosensitive resin composition coated on a silicon wafer is dried at 120° C. for 3 minutes, and the obtained coating film is heated at 200° C. for 10 minutes or at 320° C. for 10 minutes to form a cured film (the cured film formed by the heating at 200° C. is named (A), and the cured film formed by the heating at 320° C. is named (B)). The infrared absorption spectrum of the cured film (A) and that of the cured film (B) are each measured to determine the absorbance of the peak due to C=C (C=N) stretching vibration in the vicinity of 1,570 cm$^{-1}$, and the ring closure rate of the cured film (A) is calculated when the ring closure rate of the polyhydroxyamide having a polybenzoxazole precursor structure (hereinafter, sometimes simply referred to as polyhydroxyamide) in the cured film (B) is regarded as 100%.

With the photosensitive resin composition according to the present invention, a cured film having a low elastic modulus can be obtained because of the presence of the aliphatic chain, and although the aliphatic chain easily increase the ring closure rate of the polyhydroxyamide, the increase can be suppressed because of the presence of the diphenyl ether structure.

The stress can be reduced by reducing the elastic modulus and suppressing the film shrinkage due to the cyclization reaction of the polyhydroxyamide.

The cured film including the photosensitive resin composition or the photosensitive sheet according to the present invention is a heat-resistant resin film, and can be used in semiconductor devices and electronic components such as multilayer wiring boards, especially in semiconductor electronic components. Specifically, the cured film is suitably used in passivation films for semiconductors, surface protective films (semiconductor protective films) and interlayer insulating films for semiconductor elements, interlayer insulating films for multilayer wiring for high-density mounting, insulating layers for organic electroluminescent devices, and the like, and the use of the cured film is not limited thereto. The cured film can be used in various structures.

Next, an application example of the photosensitive resin composition according to the present invention to a semiconductor device having a bump will be described with reference to the drawings (Application Example 1). FIG. 1 shows an enlarged section of a pad portion of the semiconductor device having a bump according to the present invention. As shown in FIG. 1, a passivation film 3 is formed on an aluminum (hereinafter, referred to as "Al") pad 2 for input/output in on a silicon wafer 1, and a via hole is formed in the passivation film 3. Furthermore, an insulating film 4 is formed as a pattern by the photosensitive resin composition according to the present invention on the passivation film 3, a metal (Cr, Ti, or the like) film 5 is further formed so as to be connected to the Al pad 2, and a metal (Al, Cu, or the like) line 6 is formed by electrolytic plating or the like. The metal (Cr, Ti, or the like) film 5 etches the periphery of a solder bump 10 to insulate each pad. A barrier metal 8 and the solder bump 10 are formed on the insulated pad. The photosensitive resin composition of an insulating film 7 can be subjected to thick film processing in a scribe line 9. Because the resin according to the present invention has excellent high extensibility, the stress from the sealing resin can be relaxed by the deformation of the resin itself even in mounting, so that damage to a bump, a line, and a low-k layer can be prevented to provide a semiconductor device having high reliability.

Figure 2:
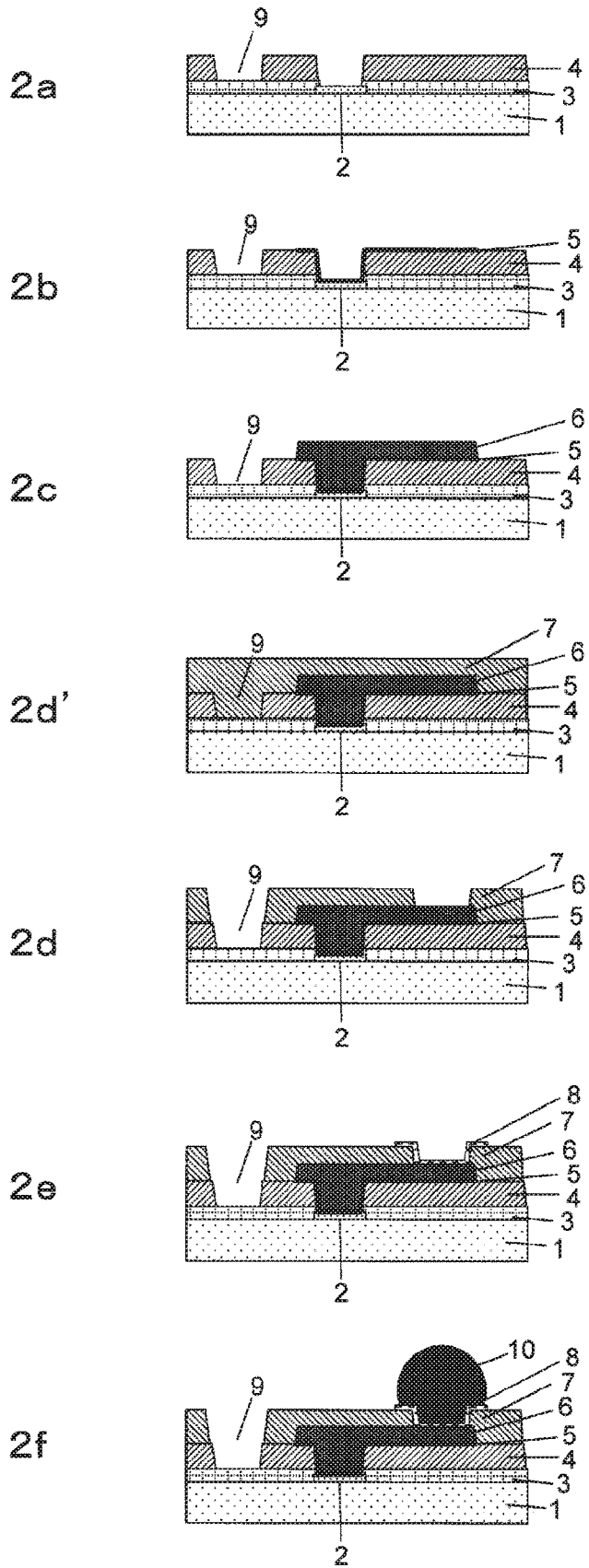
FIG. 2 shows a method of preparing a semiconductor device having a bump in detail.

Next, FIG. 2 shows a method of preparing a semiconductor device in detail. As shown in part 2a of FIG. 2, an Al pad 2 for input/output and a passivation film 3 are formed on a silicon wafer 1, and an insulating film 4 is formed as a pattern by the photosensitive resin composition according to the present invention. Subsequently, as shown in part 2b of FIG. 2, a metal (Cr, Ti, or the like) film 5 is formed so as to be connected to the Al pad 2, and as shown in part 2c of FIG. 2, a metal (Al, Cu, or the like) line 6 is formed by a plating method. Next, as shown in part 2d of FIG. 2, the photosensitive resin composition according to the present invention is applied, and an insulating film 7 is formed as a pattern as shown in part 2d of FIG. 2 through a photolithography process. An additional line (so-called redistribution line) can be formed on the insulating film 7. In the case of forming a multilayer wiring structure having two or more layers, the above-described steps are repeated to form a multilayer wiring structure in which two or more redistribution lines are separated from each other by the interlayer insulating film obtained from the resin composition according to the present invention. At this time, although the formed insulating film comes into contact with various chemicals a plurality of times, a good multilayer wiring structure can be formed because the insulating film obtained from the resin composition according to the present invention has excellent adhesion property. There is no upper limit on the number of layers in the multilayer wiring structure, and a structure having 10 or less layers is often used.

Next, as shown in parts 2e and 2f of FIG. 2, a barrier metal 8 and a solder bump 10 are formed. Then, the resulting product is diced along the last scribe line 9 to cut into chips.

Figure 3:
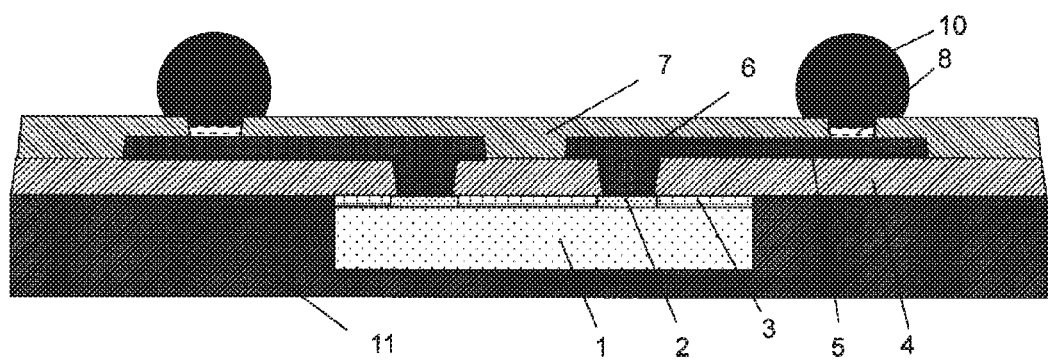
FIG. 3 shows an enlarged section of a pad portion of a semiconductor device having the insulating film according to the present invention.

Next, an Application Example 2 of the photosensitive resin composition according to the present invention to a semiconductor device having a bump will be described with reference to the drawings. FIG. 3 shows an enlarged section of a pad portion of a semiconductor device having the insulating film according to the present invention, and shows a structure called a fan-out wafer level package (fan-out WLP). A silicon wafer 1 on which an Al pad 2 and a passivation film 3 are formed is diced to cut into chips in the same manner as in Application Example 1 described above, and then sealed with a sealing resin 11. An insulating film 4 is formed as a pattern by the photosensitive resin composition according to the present invention over the sealing resin 11 and the chip, and a metal (Cr, Ti, or the like) film 5 and a metal (Al, Cu, or the like) line 6 are formed. Then, a barrier metal 8 and a solder bump 10 are formed at the opening of an insulating film 7 formed on the sealing resin outside the chip. A fan-out WLP is a semiconductor package in which an extension is provided around a semiconductor chip using a sealing resin such as an epoxy resin, a redistribution line is provided from the electrode on the semiconductor chip to the extension, and a solder ball is mounted also on the extension to secure the required number of terminals. In the fan-out WLP, a line is set across the boundary line formed by the main surface of the semiconductor chip and the main surface of the sealing resin. That is, an interlayer insulating film is formed on a base material including two or more materials that are a semiconductor chip provided with a metal line, and a sealing resin, and a line is formed on the interlayer insulating film.

Next, a method for producing a fan-out WLP by an RDL (redistribution layer) first method will be described in which the photosensitive resin composition according to the present invention is placed as an interlayer insulating film between redistribution lines, and a silicon chip and a sealing resin are placed thereon.

A glass substrate, a silicon wafer, or a ceramic substrate is used as a supporting substrate. A material for temporary attachment is placed on the supporting substrate. As the material, polyimide, polysiloxane, or the like is suitably used, and the material is placed by a laminating device such as a roll laminator or a vacuum laminator, or by manual attachment. A redistribution layer including, as an interlayer insulating film, an insulating film obtained from the photosensitive resin composition or the photosensitive sheet according to the present invention is formed on the material, a silicon chip and a sealing resin are placed, and then the supporting substrate on which the material for temporary attachment is placed and the redistribution layer are separated.

In such a package, a glass substrate or the like that is more easily warped than a silicon wafer is often used as the supporting substrate, so that the insulating film preferably has low stress, and the photosensitive resin composition according to the present invention is suitably used.

Not only in the above-described package, but also in a semiconductor package in which a semiconductor chip is embedded in a recess formed in a glass epoxy resin substrate, a line is set across the boundary line between the main surface of the semiconductor chip and the main surface of the printed substrate. Also in this aspect, an interlayer insulating film is formed on a base material including two or more materials, and a line is formed on the interlayer insulating film. The cured film produced by curing the resin composition according to the present invention has high extensibility and high adhesion strength to a semiconductor chip provided with a metal line and also to a sealing resin such as an epoxy resin, so that the cured film is suitably used as an interlayer insulating film provided on a base material including two or more materials.

Furthermore, in a fan-out WLP, the miniaturization of the redistribution line is promoted. The cured film of the photosensitive resin composition according to the present invention has a high adhesion property to a metal even when the width of a metal line and the distance between adjacent metals are 5 μm or less, so that the cured film is suitably used also in a fine redistribution line.

Figure 4:
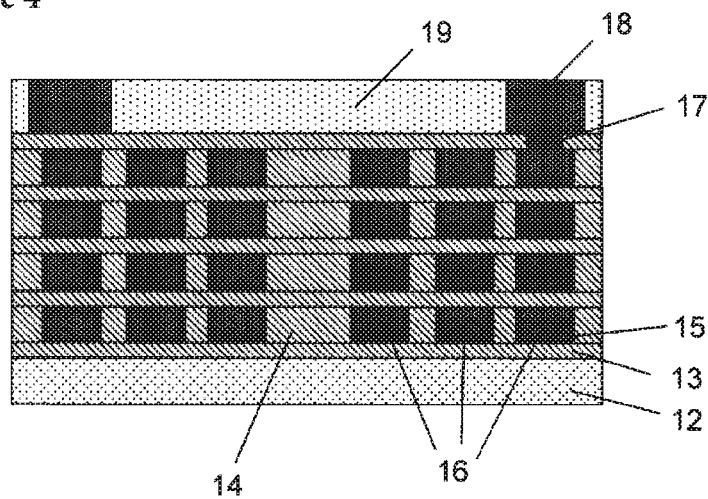
FIG. 4 shows a section of a coil component having the insulating film according to the present invention.

Next, an Application Example 3 of the photosensitive resin composition according to the present invention to a coil component of an inductor device will be described with reference to the drawings. FIG. 4 shows a section of a coil component having the insulating film according to the present invention. As shown in FIG. 4, an insulating film 13 is formed on a substrate 12, and an insulating film 14 is formed on the insulating film 13 as a pattern. Ferrite or the like is used as the substrate 12. The photosensitive resin composition according to the present invention may be used in either the insulating film 13 or the insulating film 14. A metal (Cr, Ti, or the like) film 15 is formed at the opening of the pattern, and a metal (Ag, Cu, or the like) line 16 is formed by plating on the metal film 15. The metal (Ag, Cu, or the like) line 16 is spirally formed. By repeating steps 13 to 16, a plurality of times to stack the resulting products, a function as a coil can be obtained. Finally, the metal (Ag, Cu, or the like) line 16 is connected to an electrode 18 by a metal (Ag, Cu, or the like) line 17 and sealed with a sealing resin 19.

EXAMPLES

Hereinafter, the present invention will be described with reference to Examples, but the present invention is not limited to Examples described below.

First, the evaluation method in each Example and Comparative Example will be described. For evaluation, a photosensitive resin composition (hereinafter referred to as varnish) was used that was previously filtered through a 1 μm polytetrafluoroethylene filter (manufactured by Sumitomo Electric Industries, Ltd.).

(1) Measurement of Molecular Weight and Analysis of Monomer Ratio

The weight average molecular weight (Mw) of the synthesized alkali-soluble resin (A) was confirmed using a GPC (gel permeation chromatography) device, Waters 2690-996 (manufactured by Nihon Waters K. K.). The weight average molecular weight (Mw) was measured with a developing solvent containing 99.3% by mass of N-methyl-2-pyrrolidone (hereinafter referred to as NMP), 0.2% by mass of lithium chloride, and 0.5% by mass of phosphoric acid, and calculated in terms of polystyrene.

In order to determine the monomer ratio in the alkali-soluble resin (A), $n^1/n^2$, the resin was dissolved in deuterated dimethyl sulfoxide, and $^1$H-NMR analysis was performed. The monomer ratio, $n^1/n^2$, was calculated from the area ratio of the peak specific to each monomer component. Analysis was performed from the obtained peak area.

(2) Evaluation of Residual Film Rate after Development

The varnish was spin-coated on an 8-inch silicon wafer, and then baked on a 120° C. hot plate (using ACT-8 manufactured by Tokyo Electron Ltd.) for 3 minutes to prepare a prebaked film having a thickness of 10 μm. This film was exposed using an i-line stepper (NIKON NSR i9) at an exposure dose of 0 to 1,000 mJ/cm$^2$ with a step of 10 mJ/cm$^2$. After the exposure, the film was developed with 2.38% by mass tetramethylammonium (TMAH) aqueous solution (manufactured by MITSUBISHI GAS CHEMICAL COMPANY, INC., ELM-D) for 90 seconds, and then rinsed with pure water to obtain a developed film having an isolated pattern of 10 μm.

The rate of the thickness of the developed film to the thickness of the prebaked film was defined as the residual film rate (residual film rate=(thickness of developed film)/(thickness of pre-baked film)×100). The residual film rate is preferably 70% or more, and more preferably 80% or more from the viewpoint of improving the stability of pattern processing. From the viewpoint of sensitivity, the residual film rate is preferably 90% or less.

(3) Evaluation of Pattern Processability

A developed film in which an isolated pattern of 10 μm was obtained in (2) was evaluated as good, and a developed film in which no pattern was formed owing to the low solubility in the developing solution, or in which the pattern flowed out owing to the high solubility was evaluated as no good.

(4) Curing of Prebaked Film by Heat Treatment

The varnish was applied to a silicon wafer by a spin coating method using a coating and developing device ACT-8 (manufactured by Tokyo Electron Ltd.) so that the film prebaked at 120° C. for 3 minutes had a thickness of 10 μm (using a coating and developing device ACT-8). After the prebaking, the temperature was raised to 170° C. at a rate of 3.5° C./min at an oxygen concentration of 20 ppm or less under a nitrogen stream using an inert oven CLH-21CD-S (manufactured by Koyo Thermo Systems Co., Ltd.), and heat treatment was performed at 170° C. for 1 hour. When the temperature reached 50° C. or less, the silicon wafer was taken out to obtain a cured film.

(5) Evaluation of Ring Closure Rate of Polyhydroxyamide

The varnish was spin-coated on a silicon wafer and dried at 120° C. for 3 minutes to obtain a coating film having a thickness of 5 μm. The coating film was heated on a hot plate at 200° C. for 10 minutes to prepare a cured film A, and at 320° C. for 10 minutes to prepare a cured film B. The infrared absorption spectrum of the cured film A and that of the cured film B were each measured, and the absorbance of the peak due to C=C (C=N) stretching vibration in the vicinity of 1,570 cm$^{-1}$ was determined. The ring closure rate of the cured film A was calculated when the ring closure rate of the polyhydroxyamide in the cured film B was regarded as 100%. The ring closure rate is preferably 60% or less, more preferably 40% or less, and still more preferably 20% or less from the viewpoint of reducing stress.

(6) Measurement of Content of Compound (D) in Cured Film

The photosensitive resin composition was applied to an 8-inch silicon wafer by a spin coating method using a coating and developing device ACT-8, and baked at 120° C. for 3 minutes on a hot plate to prepare a prebaked film having a thickness of 11.0 μm. Then, the prebaked film was developed with a 2.38% TMAH aqueous solution using the ACT-8 for a time required to reduce the film thickness by 1.0 μm during the development, then rinsed with pure water, and shaken off and dried, and the developed solid film was heat-treated in an inert oven under the conditions described in (4) to obtain a cured film.

The thickness of the obtained cured film was measured, and a piece of 1×5 cm was cut out from the cured film, and the component of the piece was adsorbed and captured by the purge and trap method. Specifically, the cut-out piece of the cured film was heated at 250° C. for 60 minutes using helium as a purge gas, and the desorbed component was collected in an adsorption tube.

The collected component was thermally desorbed using a thermal desorption device under the primary desorption conditions of 260° C. for 15 minutes and the secondary adsorption and desorption conditions of −27° C. and 320° C. for 5 minutes, and then GC-MS analysis was performed using a GC-MS device 7890/5975C (manufactured by Agilent Technologies, Inc.) under the conditions of a column temperature: 40 to 300° C., a carrier gas: helium (1.5 mL/min), and a scan range: m/Z 29 to 600. The GC-MS analysis of each component of the compound (D) was performed under the same conditions as described above to prepare a calibration curve, and the amount of the generated gas was calculated with the calibration curve.

The obtained value (μg) was divided by an area of 5 cm$^2$ to obtain a value by μg/cm$^2$. The value was divided by a value obtained by multiplying the density (μg/cm$^3$) of the alkali-soluble resin (A) by the film thickness (cm), and was multiplied by 1,000,000 to calculate the total content (ppm) of the compound (D) in the cured film.

(7) Evaluation of Stress

The cured film obtained in (6) was measured with a stress device FLX2908 (manufactured by KLA-Tencor Corporation). The stress is preferably 25 MPa or less, and more preferably 20 MPa.

(8) Evaluation of Elastic Modulus and Extensibility

The varnish was applied to an 8-inch silicon wafer by a spin coating method using a coating and developing device ACT-8, prebaked so that the film prebaked at 120° C. for 3 minutes had a thickness of 11 μm, and then heat-treated using an inert oven CLH-21CD-S (manufactured by Koyo Thermo Systems Co., Ltd.) under the conditions described in (4). When the temperature reached 50° C. or less, the wafer was taken out and immersed in 45% by mass of hydrofluoric acid for 5 minutes to peel the resin composition film off the wafer. This film was cut into a strip having a width of 1 cm and a length of 9 cm, and pulled at a pulling speed of 50 mm/min at a room temperature of 23.0° C. and a humidity of 45.0% RH using Tensilon RTM-100 (manufactured by ORIENTEC CORPORATION) to measure the elongation at break and the tensile elastic modulus. The measurement was performed on 10 strips per sample, and the average of the top 5 measured values ranked in descending order was determined from the results. The elongation at break is preferably 40% or more, more preferably 50% or more, and still more preferably 70% or more. The elastic modulus is preferably 2.5 MPa or less, and more preferably 2.0 MPa or less.

(9) Evaluation of Extensibility after High Temperature Test (Evaluation of Heat Resistance)

The cured film obtained in (8) was subjected to a storage test in the air at 150° C. for 500 hours using a high temperature storage tester. The wafer was taken out and immersed in 45% by mass of hydrofluoric acid for 5 minutes to peel the resin composition film off the wafer. This film was cut into a strip having a width of 1 cm and a length of 9 cm, and pulled at a pulling speed of 50 mm/min at a room temperature of 23.0° C. and a humidity of 45.0% RH using Tensilon RTM-100 (manufactured by ORIENTEC CORPORATION) to measure the elongation at break. The measurement was performed on 10 strips per sample, and the average of the top 5 measured values ranked in descending order was determined from the results. The elongation at break after the high temperature test is preferably 30% or more, and more preferably 50% or more.

(10) Evaluation of Extensibility at Low Temperature

The strip-shaped cured film obtained in (8) was pulled at a pulling speed of 50 mm/min in an atmosphere of −55° C. to measure the elongation at break. The measurement was performed on 10 strips per sample, and the average of the top 5 measured values ranked in descending order was determined from the results. The elongation at break at low temperature is preferably 15% or more, and more preferably 20% or more.

(11) Evaluation of Adhesion Property to Cu

On a silicon wafer, 100 nm of titanium and copper were sputtered, and then copper plating film having a thickness of 2 μm was formed by electrolytic plating to prepare a substrate having the above-described metal material layer on the surface (copper-plated substrate). The varnish was applied to the substrate by a spin coating method using a spinner (manufactured by Mikasa Co., Ltd.), and then baked at 120° C. for 3 minutes using a hot plate (D-SPIN manufactured by Dainippon Screen Mfg. Co., Ltd.) to finally prepare a prebaked film having a thickness of 8 μm. The film was cured using a clean oven (CLH-21CD-S manufactured by Koyo Thermo Systems Co., Ltd.) under a nitrogen stream (at an oxygen concentration of 20 ppm or less) at 140° C. for 30 minutes, and then further for 1 hour at a temperature raised to 200° C. to obtain a photosensitive resin cured film. The cured film was incised with a grid shape having 10 rows and 10 columns at 2 mm intervals using a single-edged blade, and then subjected to a storage test at 150° C. for 500 hours in the atmosphere using a high temperature storage tester. The number of pieces, of 100 pieces, that was peeled away by peeling with Sellotape (registered trademark) was counted to evaluate the adhesion property between the metal material/the resin cured film. The number of peeled pieces is preferably 20 or less, and more preferably 0.

Abbreviated names of acid dianhydrides and diamines shown in Examples and Comparative Examples described below are as follows.

ODPA: 3,3',4,4'-diphenyl ether tetracarboxylic acid dianhydride

SiDA: 1,1,3,3-tetramethyl-1,3-bis(3-aminopropyl)disiloxane

BAHF: 2,2-bis(3-amino-4-hydroxyphenyl) hexafluoropropane

DMIB: N,N-dimethylisobutyramide (boiling point: 176° C., melting point: −34° C., molecular weight: 115.18)

DMPA: N,N-dimethylpropanamide (boiling point: 174° C., melting point: −45° C., molecular weight: 101.15)

MDMPA: 3-methoxy-N,N-dimethylpropanamide (boiling point: 215° C., melting point: −49° C., molecular weight: 131.17)

BC: diethylene glycol monobutyl ether (boiling point: 231° C., melting point: −68° C., molecular weight: 162.23)

KBM-1003: vinyltrimethoxysilane

NMP: N-methyl-2-pyrrolidone

NA: 5-norbornene-2,3-dicarboxylic acid

GBL: γ-butyrolactone (boiling point: 204° C., melting point: −44° C.)

Diamine A: 4,4-diaminodiphenyl ether

Diamine B: 3,4-diaminodiphenyl ether

Diamine C: bis{4-(4-aminophenoxy)phenyl}ether

Synthesis Example A: Synthesis of Dicarboxylic Acid Derivative A

Under a nitrogen stream, 27.2 g (0.4 mol) of imidazole was put in a 250 ml three-necked flask, and dissolved in 100 g of NMP by stirring at room temperature. The mixture was cooled to −5° C. or less, and a liquid prepared by dissolving dodecanedioic acid dichloride (26.72 g, 0.1 mol) in 100 g of NMP was added dropwise over 1 hour so that the temperature of the reaction solution was 0° C. or less. After the dropping, the reaction solution was stirred at room temperature further for 3 hours, and poured into 1 L of pure water, and the precipitate was filtered. The filtered precipitate was washed with pure water several times and dried in a vacuum oven at 50° C. for 100 hours to obtain a dicarboxylic acid derivative A represented by the following formula.

[Chem. 16]

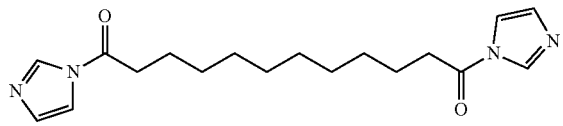

Synthesis Example B: Synthesis of Dicarboxylic Acid Derivative B

Under a nitrogen stream, 27.2 g (0.4 mol) of imidazole was put in a 250 ml three-necked flask, 100 g of methylene chloride was put, and the mixture was stirred at room temperature. The mixture was cooled to −5° C. or less, and a liquid prepared by dispersing 29.5 g (0.1 mol) of 4,4'-diphenyl ether dicarboxylic acid dichloride in 100 g of methylene chloride was added dropwise over 1 hour so that the temperature of the reaction solution was 0° C. or less. After the dropping, the reaction solution was stirred at room temperature further for 3 hours, and the precipitate generated during the reaction was filtered. The filtered precipitate was washed with pure water several times and dried in a vacuum oven at 50° C. for 100 hours to obtain a dicarboxylic acid derivative B represented by the following formula.

[Chem. 17]

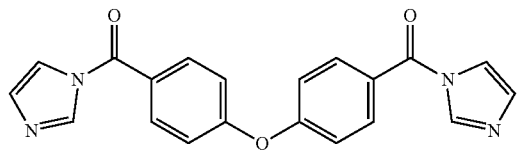

Example 1

[Synthesis of Resin (a)]

Under a dry nitrogen stream, diamine A (2.00 g, 0.010 mol), BAHF (12.82 g, 0.035 mol), and SiDA (0.62 g, 0.0025 mol) were dissolved in 100 g of NMP. Here, the dicarboxylic acid derivative A (4.96 g, 0.015 mol), the dicarboxylic acid derivative B (10.75 g, 0.030 mol), ODPA (0.78 g, 0.0025 mol), NA (0.82 g, 0.0050 mol), and 25 g of NMP were added, and the mixture was reacted at 85° C. for 3 hours. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (a) powder. From the peak ratio of the $^1$H-NMR spectrum of each component of the resin, the molar ratio of the aliphatic chain in the acid component was 32 mol %, the molar ratio of the diphenyl ether structure in the diamine component was 21 mol %, and $n^1/n^2$ was 18.0. The molar ratio and the like of each resin component are shown in Tables 1 and 2.

[Preparation and Evaluation of Varnish]

To 10 g of the obtained resin (a), 2.0 g of a photo acid generator represented by the following formula, 0.5 g of HMOM-TPHAP, 0.5 g of MW-100LM, 0.1 g of KBM-1003, and 20 g of γ-butyrolactone as a solvent were added to prepare a varnish. The results of evaluation of the photosensitive property of the obtained varnish and the property of the cured film are shown in Tables 3 and 4.

[Chem. 18]

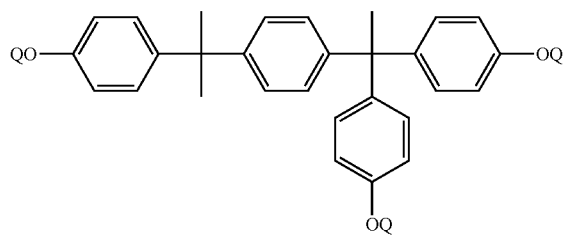

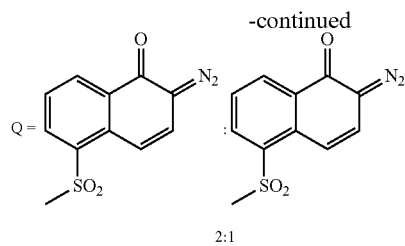

Q =

2:1

Example 2

[Synthesis of Resin (b)]

Under a dry nitrogen stream, diamine A (2.00 g, 0.010 mol) and BAHF (13.73 g, 0.038 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (b) powder. From the peak ratio of the $^1$H-NMR spectrum of each component of the resin, the molar ratio of the aliphatic chain in the acid component was 47 mol %, the molar ratio of the diphenyl ether structure in the diamine component was 20 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (b). The results of evaluation of the photosensitive property of the obtained varnish and the property of the cured film are shown in Tables 3 and 4.

Example 3

[Synthesis of Resin (c)]

Under a dry nitrogen stream, diamine A (2.00 g, 0.010 mol) and BAHF (12.82 g, 0.038 mol) were dissolved in 100 g of NMP. Here, the dicarboxylic acid derivative A (9.91 g, 0.030 mol), the dicarboxylic acid derivative B (5.38 g, 0.015 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (c) powder. From the peak ratio of the $^1$H-NMR spectrum of each component of the resin, the molar ratio of the aliphatic chain in the acid component was 63 mol %, the molar ratio of the diphenyl ether structure in the diamine component was 21 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (c). The results of evaluation of the photosensitive property of the obtained varnish and the property of the cured film are shown in Tables 3 and 4.

Example 4

[Synthesis of Resin (d)]

Under a dry nitrogen stream, diamine A (0.50 g, 0.0025 mol) and BAHF (15.57 g, 0.043 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (d) powder. From the peak ratio of the $^1$H-NMR spectrum of each component of the resin, the molar ratio of the aliphatic chain in the acid component was 47 mol %, the molar ratio of the diphenyl ether structure in the diamine component was 5 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (d). The results of evaluation of the photosensitive property of the obtained varnish and the property of the cured film are shown in Tables 3 and 4.

Example 5

[Synthesis of Resin (e)]

Under a dry nitrogen stream, diamine A (2.50 g, 0.013 mol) and BAHF (12.82 g, 0.035 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (e) powder. From the peak ratio of the $^1$H-NMR spectrum of each component of the resin, the molar ratio of the aliphatic chain in the acid component was 47 mol %, the molar ratio of the diphenyl ether structure in the diamine component was 25 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (e). The results of evaluation of the photosensitive property of the obtained varnish and the property of the cured film are shown in Tables 3 and 4.

Example 6

[Synthesis of Resin (f)]

Under a dry nitrogen stream, diamine A (2.00 g, 0.010 mol) and BAHF (12.82 g, 0.035 mol) were dissolved in 100 g of NMP. Here, the dicarboxylic acid derivative A (5.29 g, 0.016 mol), the dicarboxylic acid derivative B (9.85 g, 0.028 mol), and 25 g of NMP were added, and the mixture was reacted at 85° C. for 3 hours. Next, SiDA (0.62 g, 0.0025 mol), ODPA (1.24 g, 0.0040 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (f) powder. From the peak ratio of the $^1$H-NMR spectrum of each component of the resin, the molar ratio of the aliphatic chain in the acid component was 34 mol %, the molar ratio of the diphenyl ether structure in the diamine component was 21 mol %, and $n^1/n^2$ was 10.9. The molar ratio and the like of each resin component are shown in Tables 1 and 2.

[Preparation and Evaluation of Varnish]

A varnish was prepared in the same manner as in Example 1 using 10 g of the obtained resin (f). The results of evaluation of the photosensitive property of the obtained varnish and the property of the cured film are shown in Tables 3 and 4.

Example 7

[Synthesis of Resin (g)]

Under a dry nitrogen stream, diamine B (2.00 g, 0.010 mol) and BAHF (13.73 g, 0.038 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (g) powder. From the peak ratio of the $^1$H-NMR spectrum of each component of the resin, the molar ratio of the aliphatic chain in the acid component was 47 mol %, the molar ratio of the diphenyl ether structure in the diamine component was 20 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (g). The results of evaluation of the photosensitive property of the obtained varnish and the property of the cured film are shown in Tables 3 and 4.

Example 8

[Synthesis of Resin (h)]

Under a dry nitrogen stream, diamine C (3.68 g, 0.010 mol) and BAHF (13.73 g, 0.038 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (h) powder. From the peak ratio of the $^1$H-NMR spectrum of each component of the resin, the molar ratio of the aliphatic chain in the acid component was 47 mol %, the molar ratio of the diphenyl ether structure in the diamine component was 20 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (h). The results of evaluation of the photosensitive property of the obtained varnish and the property of the cured film are shown in Tables 3 and 4.

Example 9

[Synthesis of Resin (i)]

Under a dry nitrogen stream, diamine A (1.50 g, 0.0075 mol), BAHF (12.82 g, 0.035 mol), and RT-1000 (manufactured by Huntsman International LLC.) (5.00 g, 0.0050 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (i) powder. From the peak ratio of the $^1$H-NMR spectrum of each component of the resin, the molar ratio of the aliphatic chain in the acid component was 47 mol %, the molar ratio of the diphenyl ether structure in the diamine component was 15 mol %, $n^1/n^2$ was 18.0, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (i). The results of evaluation of the photosensitive property of the obtained varnish and the property of the cured film are shown in Tables 3 and 4.

Example 10

[Synthesis of Resin (j)]

Under a dry nitrogen stream, diamine A (1.50 g, 0.0075 mol), BAHF (10.99 g, 0.030 mol), and RT-1000 (manufactured by Huntsman International LLC.) (10.00 g, 0.010 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (j) powder. From the peak ratio of the $^1$H-NMR spectrum of each component of the resin, the molar ratio of the aliphatic chain in the acid component was 47 mol %, the molar ratio of the diphenyl ether structure in the diamine component was 15 mol %, $n^1/n^2$ was 18.0, and the molar ratio of the polyether structure in the diamine component was 20 mol %. The molar ratio and the like of each resin component are shown in Tables 1 and 2.

[Preparation and Evaluation of Varnish]

A varnish was prepared in the same manner as in Example 1 using 10 g of the obtained resin (j). The results of evaluation of the photosensitive property of the obtained varnish and the property of the cured film are shown in Tables 3 and 4.

Example 11

[Synthesis of Resin (k)]

Under a dry nitrogen stream, diamine A (1.50 g, 0.0075 mol), BAHF (9.16 g, 0.025 mol), and RT-1000 (manufactured by Huntsman International LLC.) (15.00 g, 0.015 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (k) powder. From the peak ratio of the $^1$H-NMR spectrum of each component of the resin, the molar ratio of the aliphatic chain in the acid component was 47 mol %, the molar ratio of the diphenyl ether structure in the diamine component was 15 mol %, $n^1/n^2$ was 18.0, and the molar ratio of the polyether structure in the diamine component was 30 mol %. The molar ratio and the like of each resin component are shown in Tables 1 and 2.

[Preparation and Evaluation of Varnish]

A varnish was prepared in the same manner as in Example 1 using 10 g of the obtained resin (k). The results of evaluation of the photosensitive property of the obtained varnish and the property of the cured film are shown in Tables 3 and 4.

Example 12

[Preparation and Evaluation of Varnish]

To 10 g of the resin (b) obtained in Example 2, 2.0 g of the same photo acid generator as that in Example 1, 0.5 g of HMOM-TPHAP, 0.5 g of MW-100LM, 0.1 g of KBM-1003, 16 g of γ-butyrolactone as a solvent, and 4 g of DMIB as a compound (D-1) were added to prepare a varnish. The results of evaluation of the photosensitive property of the obtained varnish and the property of the cured film are shown in Tables 3 and 4.

Example 13

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 16 g of γ-butyrolactone as a solvent, and 4 g of DMIB as a compound (D-1) were added to prepare a varnish. The results of evaluation of the photosensitive property of the obtained varnish and the property of the cured film are shown in Tables 3 and 4.

Example 14

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 16 g of γ-butyrolactone as a solvent, and 4 g of DMPA as a compound (D-2) were added to prepare a varnish. The results of evaluation of the photosensitive property of the obtained varnish and the property of the cured film are shown in Tables 3 and 4.

Example 15

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 16 g of γ-butyrolactone as a solvent, and 4 g of MDMPA as a compound (D-2) were added to prepare a varnish. The results of evaluation of the photosensitive property of the obtained varnish and the property of the cured film are shown in Tables 3 and 4.

Example 16

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 16 g of γ-butyrolactone as a solvent, and 4 g of BC as a compound (D-2) were added to prepare a varnish. The results of evaluation of the photosensitive property of the obtained varnish and the property of the cured film are shown in Tables 3 and 4.

Example 17

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 12 g of γ-butyrolactone as a solvent, and 8 g of MDMPA as a compound (D-2) were added to prepare a varnish. The results of evaluation of the photosensitive property of the obtained varnish and the property of the cured film are shown in Tables 3 and 4.

Example 18

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 12 g of γ-butyrolactone as a solvent, and 8 g of BC as a compound (D-2) were added to prepare a varnish. The results of evaluation of the photosensitive property of the obtained varnish and the property of the cured film are shown in Tables 3 and 4.

Example 19

[Preparation and Evaluation of Varnish]

To 10 g of the resin (j) obtained in Example 10, 2.0 g of the same photo acid generator as that in Example 1, 0.5 g of HMOM-TPHAP, 0.5 g of MW-100LM, 0.1 g of KBM-1003, 8 g of γ-butyrolactone as a solvent, and 12 g of BC as a compound (D-2) were added to prepare a varnish. The results of evaluation of the photosensitive property of the obtained varnish and the property of the cured film are shown in Tables 3 and 4.

Comparative Example 1

[Synthesis of Resin (1)]

Under a dry nitrogen stream, diamine A (1.00 g, 0.0050 mol), BAHF (13.73 g, 0.038 mol), RT-1000 (5.00 g, 0.0050 mol), and SiDA (0.62 g, 0.0025 mol) were dissolved in 100 g of NMP. Here, NA (0.82 g, 0.0050 mol) and 25 g of NMP were added, the mixture was reacted at 85° C. for 1 hour, then the dicarboxylic acid derivative A (11.57 g, 0.035 mol), the dicarboxylic acid derivative B (5.38 g, 0.015 mol), and 25 g of NMP were added, and the mixture was reacted at 85° C. for 3 hours. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (1) powder. The resin (1) is not a resin prepared by copolymerizing a polyamide structure and a polyimide structure, but a polyamide resin. From the peak ratio of the $^1$H-NMR spectrum of each component of the resin, the molar ratio of the aliphatic chain in the acid component was 70 mol %, the molar ratio of the diphenyl ether structure in the diamine component was 10 mol %, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (1). The results of evaluation of the photosensitive property of the obtained varnish and the property of the cured film are shown in Tables 3 and 4.

Comparative Example 2

[Synthesis of Resin (m)]

Under a dry nitrogen stream, diamine A (1.00 g, 0.0050 mol), BAHF (13.73 g, 0.038 mol), RT-1000 (5.00 g, 0.0050 mol), and SiDA (0.62 g, 0.0025 mol) were dissolved in 100 g of NMP. Here, NA (0.82 g, 0.0050 mol) and 25 g of NMP were added, the mixture was reacted at 85° C. for 1 hour, then ODPA (14.74 g, 0.048 mol) and 25 g of NMP were added, and the mixture was reacted at 85° C. for 3 hours. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (m) powder. From the peak ratio of the $^1$H-NMR spectrum of each component of the resin, the molar ratio of the diphenyl ether structure in the diamine component was 10 mol %, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (m). The results of evaluation of the photosensitive property of the obtained varnish and the property of the cured film are shown in Tables 3 and 4.

Comparative Example 3

[Synthesis of Resin (n)]

Under a dry nitrogen stream, BAHF (15.57 g, 0.043 mol) and RT-1000 (5.00 g, 0.0050 mol) were dissolved in 100 g of NMP. Here, the dicarboxylic acid derivative B (16.13 g, 0.045 mol) and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (n) powder. From the peak ratio of the $^1$H-NMR spectrum of each component of the resin, $n^1/n^2$ was 18.0, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (n). The results of evaluation of the photosensitive property of the obtained varnish and the property of the cured film are shown in Tables 3 and 4.

Comparative Example 4

[Synthesis of Resin (o)]

Under a dry nitrogen stream, BAHF (17.40 g, 0.048 mol) was dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (o) powder. From the peak ratio of the $^1$H-NMR spectrum of each component of the resin, the molar ratio of the aliphatic chain in the acid component was 47 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (o). The results of evaluation of the photosensitive property of the obtained varnish and the property of the cured film are shown in Tables 3 and 4.

Comparative Example 5

[Synthesis of Resin (p)]

Under a dry nitrogen stream, diamine A (1.00 g, 0.005 mol) and BAHF (14.65 g, 0.040 mol) were dissolved in 100 g of NMP. Here, the dicarboxylic acid derivative B (15.23 g, 0.043 mol) and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (p) powder. From the peak ratio of the $^1$H-NMR spectrum of each component of the resin, the molar ratio of the diphenyl ether structure in the diamine component was 11 mol %, and $n^1/n^2$ was 17.0. The molar ratio and the like of each resin component are shown in Tables 1 and 2.

[Preparation and Evaluation of Varnish]

A varnish was prepared in the same manner as in Example 1 using 10 g of the obtained resin (p). The results of evaluation of the photosensitive property of the obtained varnish and the property of the cured film are shown in Tables 3 and 4.

Comparative Example 6

[Synthesis of Resin (q)]

Under a dry nitrogen stream, diamine A (1.00 g, 0.005 mol), BAHF (13.73 g, 0.038 mol), and RT-1000 (5.00 g, 0.0050 mol) were dissolved in 100 g of NMP. Here, the dicarboxylic acid derivative B (15.23 g, 0.043 mol) and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (q) powder. From the peak ratio of the $^1$H-NMR spectrum of each component of the resin, the molar ratio of the diphenyl ether structure in the diamine component was 10 mol %, $n^1/n^2$ was 17.0, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (q). The results of evaluation of the photosensitive property of the obtained varnish and the property of the cured film are shown in Tables 3 and 4.

Comparative Example 7

[Synthesis of Resin (r)]

Under a dry nitrogen stream, diamine A (2.00 g, 0.010 mol) and BAHF (13.73 g, 0.038 mol) were dissolved in 100 g of NMP. Here, the dicarboxylic acid derivative A (2.48 g, 0.0075 mol), the dicarboxylic acid derivative B (13.44 g, 0.0375 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (r) powder. From the peak ratio of the $^1$H-NMR spectrum of each component of the resin, the molar ratio of the aliphatic chain in the acid component was 16 mol %, the molar ratio of the diphenyl ether structure in the diamine component was 20 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (r). The results of evaluation of the photosensitive property of the obtained varnish and the property of the cured film are shown in Tables 3 and 4.

Comparative Example 8

[Synthesis of Resin (s)]

Under a dry nitrogen stream, diamine A (2.00 g, 0.010 mol) and BAHF (13.73 g, 0.038 mol) were dissolved in 100 g of NMP. Here, the dicarboxylic acid derivative A (13.22 g, 0.040 mol), the dicarboxylic acid derivative B (1.79 g, 0.0050 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (s) powder. From the peak ratio of the $^1$H-NMR spectrum of each component of the resin, the molar ratio of the aliphatic chain in the acid component was 84 mol %, the molar ratio of the diphenyl ether structure in the diamine component was 20 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (s). The results of evaluation of the photosensitive property of the obtained varnish and the property of the cured film are shown in Tables 3 and 4.

Comparative Example 9

[Synthesis of Resin (t)]

Under a dry nitrogen stream, diamine A (4.00 g, 0.020 mol) and BAHF (0.07 g, 0.028 mol) were dissolved in 100 g of NMP. Here, the dicarboxylic acid derivative A (7.43 g, 0.023 mol), the dicarboxylic acid derivative B (8.06 g, 0.023 mol), and 25 g of NMP were added, and the mixture was reacted at 85° C. for 3 hours. Next, SiDA (0.62 g, 0.0025 mol), ODPA (0.78 g, 0.0025 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (t) powder. From the peak ratio of the $^1$H-NMR spectrum of each component of the resin, the molar ratio of the aliphatic chain in the acid component was 47 mol %, the molar ratio of the diphenyl ether structure in the diamine component was 40 mol %, and $n^1/n^2$ was 18.0. The molar ratio and the like of each resin component are shown in Tables 1 and 2.

[Preparation and Evaluation of Varnish]

A varnish was prepared in the same manner as in Example 1 using 10 g of the obtained resin (t). The results of evaluation of the photosensitive property of the obtained varnish and the property of the cured film are shown in Tables 3 and 4.

Example 20

[Synthesis of Resin (u)]

Under a dry nitrogen stream, diamine A (1.00 g, 0.0050 mol), BAHF (13.73 g, 0.038 mol), and RT-1000 (5.00 g, 0.0050 mol) were dissolved in 100 g of NMP. Here, the dicarboxylic acid derivative A (6.61 g, 0.020 mol), the dicarboxylic acid derivative B (7.17 g, 0.020 mol), and 25 g of NMP were added, and the mixture was reacted at 85° C. for 3 hours. Next, SiDA (0.62 g, 0.0025 mol), ODPA (3.10 g, 0.010 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (u) powder. From the peak ratio of the $^1$H-NMR spectrum of each component of the resin, the molar ratio of the aliphatic chain in the acid component was 40 mol %, the molar ratio of the diphenyl ether structure in the diamine component was 10 mol %, $n^1/n^2$ was 4.0, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (u). The results of evaluation of the photosensitive property of the obtained varnish and the property of the cured film are shown in Tables 3 and 4.

Example 21

[Synthesis of Resin (v)]

Under a dry nitrogen stream, diamine A (1.00 g, 0.0050 mol), BAHF (13.73 g, 0.038 mol), and RT-1000 (5.00 g, 0.0050 mol) were dissolved in 100 g of NMP. Here, the dicarboxylic acid derivative A (9.09 g, 0.028 mol), the dicarboxylic acid derivative B (10.75 g, 0.030 mol), and 25 g of NMP were added, and the mixture was reacted at 85° C. for 3 hours. Next, SiDA (0.62 g, 0.0025 mol), ODPA (0.62 g, 0.0020 mol), NA (0.82 g, 0.0050 mol), and 25 g of NMP were added, and the mixture was reacted at 85° C. for 1 hour. After the reaction was completed, the mixture was cooled to room temperature, acetic acid (13.20 g, 0.25 mol) and 25 g of NMP were added, and the mixture was stirred at room temperature for 1 hour. After the stirring was completed, the solution was poured into 1.5 L of water to obtain a white precipitate. The precipitate was collected by filtration, washed with water three times, and then dried with a ventilation dryer at 50° C. for 3 days to obtain a resin (v) powder. From the peak ratio of the $^1$H-NMR spectrum of each component of the resin, the molar ratio of the aliphatic chain in the acid component was 46 mol %, the molar ratio of the diphenyl ether structure in the diamine component was 10 mol %, $n^1/n^2$ was 28.8, and the molar ratio of the polyether structure in the diamine component was 10 mol %. The molar ratio and the like of each resin component are shown in Tables 1 and 2.

[Preparation and Evaluation of Varnish]

A varnish was prepared in the same manner as in Example 1 using 10 g of the obtained resin (v). The results of evaluation of the photosensitive property of the obtained varnish and the property of the cured film are shown in Tables 3 and 4.

TABLE 1

| Alkali-soluble resin (A) | Diamine (molar ratio) | | | | | | Acid dicarboxylic acid derivative (molar ratio) | | Acid dianhydride (molar ratio) | End cap compound (molar ratio) |
|---|---|---|---|---|---|---|---|---|---|---|
| | Ph—O—Ph structure | | | Other | | | Aliphatic chain | Other | | |
| | Diamine A | Diamine B | Diamine C | BAHF | RT-1000 | SiDA | Acid A | Acid B | ODPA | NA |
| a | 20 | — | — | 70 | — | 5 | 30 | 60 | 5 | 10 |
| b | 20 | — | — | 75 | — | 5 | 45 | 45 | 5 | 10 |
| c | 20 | — | — | 70 | — | 5 | 60 | 30 | 5 | 10 |
| d | 5 | — | — | 85 | — | 5 | 45 | 45 | 5 | 10 |
| e | 25 | — | — | 70 | — | 5 | 45 | 45 | 5 | 10 |
| f | 20 | — | — | 70 | — | 5 | 32 | 55 | 8 | 10 |
| g | — | 20 | — | 75 | — | 5 | 45 | 45 | 5 | 10 |
| h | — | — | 20 | 75 | — | 5 | 45 | 45 | 5 | 10 |
| i | 15 | — | — | 70 | 10 | 5 | 45 | 45 | 5 | 10 |
| j | 15 | — | — | 60 | 20 | 5 | 45 | 45 | 5 | 10 |
| k | 15 | — | — | 50 | 30 | 5 | 45 | 45 | 5 | 10 |
| l | 10 | — | — | 75 | 10 | 5 | 70 | 30 | — | 10 |
| m | 10 | — | — | 75 | 10 | 5 | — | — | 95 | 10 |
| n | — | — | — | 85 | 10 | 5 | — | 90 | 5 | 10 |
| o | — | — | — | 95 | — | 5 | 45 | 45 | 5 | 10 |
| p | 10 | — | — | 80 | — | 5 | — | 85 | 5 | 10 |
| q | 10 | — | — | 75 | 10 | 5 | — | 85 | 5 | 10 |
| r | 20 | — | — | 75 | — | 5 | 15 | 75 | 5 | 10 |
| s | 20 | — | — | 75 | — | 5 | 80 | 10 | 5 | 10 |
| t | 40 | — | — | 55 | — | 5 | 45 | 45 | 5 | 10 |
| u | 10 | — | — | 75 | 10 | 5 | 40 | 40 | 20 | 10 |
| v | 10 | — | — | 75 | 10 | 5 | 55 | 60 | 4 | 10 |

TABLE 2

| Alkali-soluble resin (A) | Total of acids | Total of diamines | Aliphatic chain in acid component (mol %) | Diphenyl ether structure in diamine component (mol %) | $n^1/n^2$ | Polyether structure in diamine component (mol %) |
|---|---|---|---|---|---|---|
| a | 95 | 95 | 32 | 21 | 18.0 | — |
| b | 95 | 100 | 47 | 20 | 18.0 | — |
| c | 95 | 95 | 63 | 21 | 18.0 | — |
| d | 95 | 95 | 47 | 5 | 18.0 | — |
| e | 95 | 100 | 47 | 25 | 18.0 | — |
| f | 95 | 95 | 34 | 21 | 10.9 | — |
| g | 95 | 100 | 47 | 20 | 18.0 | — |
| h | 95 | 100 | 47 | 20 | 18.0 | — |
| i | 95 | 100 | 47 | 15 | 18.0 | 10 |
| j | 95 | 100 | 47 | 15 | 18.0 | 20 |
| k | 95 | 100 | 47 | 15 | 18.0 | 30 |
| l | 100 | 100 | 70 | 10 | — | 10 |
| m | 95 | 100 | — | 10 | — | 10 |
| n | 95 | 100 | — | — | 18.0 | 10 |
| o | 95 | 100 | 47 | — | 18.0 | — |
| p | 90 | 95 | — | 11 | 17.0 | — |
| q | 90 | 100 | — | 10 | 17.0 | 10 |
| r | 95 | 100 | 16 | 20 | 18.0 | — |
| s | 95 | 100 | 84 | 20 | 18.0 | — |
| t | 95 | 100 | 47 | 40 | 18.0 | — |
| u | 100 | 100 | 40 | 10 | 4.0 | 10 |
| v | 119 | 100 | 46 | 10 | 28.8 | 10 |

TABLE 3

| | Alkali-soluble resin (A) | Solvent (C) (content) | Compound (D) (content) | Photosensitive property | |
|---|---|---|---|---|---|
| | | | | Residual film rate after development % | Pattern processability |
| Example 1 | a | GBL(100%) | — | 94 | Good |
| Example 2 | b | GBL(100%) | — | 84 | Good |
| Example 3 | c | GBL(100%) | — | 76 | Good |
| Example 4 | d | GBL(100%) | — | 76 | Good |
| Example 5 | e | GBL(100%) | — | 90 | Good |
| Example 6 | f | GBL(100%) | — | 95 | Good |
| Example 7 | g | GBL(100%) | — | 82 | Good |
| Example 8 | h | GBL(100%) | — | 84 | Good |
| Example 9 | i | GBL(100%) | — | 83 | Good |
| Example 10 | j | GBL(100%) | — | 80 | Good |
| Example 11 | k | GBL(100%) | — | 69 | Good |
| Example 12 | b | GBL(80%) | DMIB(20%) | 84 | Good |
| Example 13 | j | GBL(80%) | DMIB(20%) | 80 | Good |
| Example 14 | j | GBL(80%) | DMPA(20%) | 79 | Good |
| Example 15 | j | GBL(80%) | MDMPA(20%) | 77 | Good |
| Example 16 | j | GBL(80%) | BC(20%) | 78 | Good |
| Example 17 | j | GBL(60%) | MDMPA(40%) | 70 | Good |
| Example 18 | j | GBL(60%) | BC(40%) | 67 | Good |
| Example 19 | j | GBL(40%) | BC(60%) | 50 | Good |
| Comparative Example 1 | l | GBL(100%) | — | 77 | Good |
| Comparative Example 2 | m | GBL(100%) | — | 90 | Good |
| Comparative Example 3 | n | GBL(100%) | — | 85 | Good |
| Comparative Example 4 | o | GBL(100%) | — | 76 | Good |
| Comparative Example 5 | p | GBL(100%) | — | 90 | Good |
| Comparative Example 6 | q | GBL(100%) | — | 87 | Good |
| Comparative Example 7 | r | GBL(100%) | — | 88 | Good |
| Comparative Example 8 | s | GBL(100%) | — | 30 | No good |
| Comparative Example 9 | t | GBL(100%) | — | 96 | No good |
| Example 20 | u | GBL(100%) | — | 88 | Good |
| Example 21 | v | GBL(100%) | — | 70 | Good |

TABLE 4-1

| | Property of cured film | | | | | | |
|---|---|---|---|---|---|---|---|
| | Ring closure rate of polyhydroxyamide % | Content of compound (D) ppm | Stress MPa | Elastic modulus GPa | Elongation % | Elongation [after high temperature test] % | Elongation [measured at −55° C.] % | Adhesion property to Cu after high temperature test Number of pieces peeled away/100 pieces |
| Example 1 | 7 | 0 | 24 | 2.3 | 63 | 60 | 17 | 0/100 |
| Example 2 | 12 | 0 | 21 | 2.1 | 70 | 68 | 20 | 0/100 |
| Example 3 | 28 | 0 | 23 | 2.0 | 88 | 75 | 24 | 0/100 |
| Example 4 | 18 | 0 | 22 | 2.1 | 73 | 70 | 22 | 0/100 |
| Example 5 | 9 | 0 | 21 | 2.1 | 66 | 60 | 19 | 0/100 |
| Example 6 | 8 | 0 | 24 | 2.4 | 61 | 58 | 17 | 0/100 |
| Example 7 | 15 | 0 | 23 | 2.1 | 68 | 66 | 20 | 0/100 |
| Example 8 | 15 | 0 | 23 | 2.1 | 69 | 65 | 20 | 0/100 |
| Example 9 | 14 | 0 | 19 | 2.0 | 80 | 75 | 22 | 0/100 |
| Example 10 | 15 | 0 | 19 | 2.0 | 83 | 75 | 24 | 0/100 |
| Example 11 | 18 | 0 | 20 | 2.0 | 85 | 57 | 25 | 0/100 |
| Example 12 | 12 | 0.05 | 21 | 2.1 | 70 | 68 | 21 | 0/100 |
| Example 13 | 15 | 0.05 | 19 | 2.0 | 83 | 75 | 25 | 0/100 |
| Example 14 | 15 | 0.20 | 19 | 2.0 | 83 | 75 | 26 | 0/100 |
| Example 15 | 15 | 11 | 19 | 2.0 | 83 | 75 | 28 | 0/100 |
| Example 16 | 15 | 14 | 19 | 2.0 | 83 | 74 | 31 | 0/100 |
| Example 17 | 16 | 38 | 19 | 2.0 | 84 | 73 | 33 | 0/100 |
| Example 18 | 17 | 490 | 19 | 2.0 | 84 | 70 | 34 | 0/100 |
| Example 19 | 17 | 580 | 17 | 2.0 | 84 | 60 | 36 | 10/100 |

TABLE 4-2

| | Ring closure rate of polyhydroxyamide % | Content of compound (D) ppm | Stress MPa | Elastic modulus GPa | Elongation % | Elongation [after high temperature test] % | Elongation [measured at −55° C.] % | Adhesion property to Cu after high temperature test Number of pieces peeled away/100 pieces |
|---|---|---|---|---|---|---|---|---|
| Comparative Example 1 | 68 | 0 | 28 | 2.0 | 70 | 49 | 20 | 78/100 |
| Comparative Example 2 | — | 0 | 31 | 2.6 | 25 | 20 | 10 | 0/100 |
| Comparative Example 3 | 3 | 0 | 27 | 2.6 | 40 | 39 | 15 | 0/100 |
| Comparative Example 4 | 70 | 0 | 29 | 2.2 | 65 | 60 | 17 | 40/100 |
| Comparative Example 5 | 3 | 0 | 29 | 2.6 | 40 | 38 | 12 | 0/100 |
| Comparative Example 6 | 16 | 0 | 27 | 2.5 | 40 | 36 | 11 | 0/100 |
| Comparative Example 7 | 6 | 0 | 28 | 2.6 | 44 | 38 | 12 | 0/100 |
| Comparative Example 8 | 40 | 0 | 18 | 1.8 | 70 | 30 | 20 | 18/100 |
| Comparative Example 9 | 4 | 0 | 17 | 2.3 | 60 | 58 | 15 | 0/100 |
| Example 20 | 15 | 0 | 25 | 2.5 | 58 | 50 | 15 | 0/100 |
| Example 21 | 20 | 0 | 22 | 1.9 | 70 | 57 | 20 | 10/100 |

DESCRIPTION OF REFERENCE SIGNS

1 Silicon wafer
2 Al pad
3 Passivation film
4 Insulating film
5 Metal (Cr, Ti, or the like) film
6 Metal (Al, Cu, or the like) line
7 Insulating film
8 Barrier metal
9 Scribe line
10 Solder bump
11 Sealing resin
12 Substrate
13 Insulating film
14 Insulating film
15 Metal (Cr, Ti, or the like) film
16 Metal (Ag, Cu, or the like) line
17 Metal (Ag, Cu, or the like) line
18 Electrode
19 Sealing resin

The invention claimed is:

1. An alkali-soluble resin (A) comprising a structure represented by a general formula (1),

[Chem. 1]

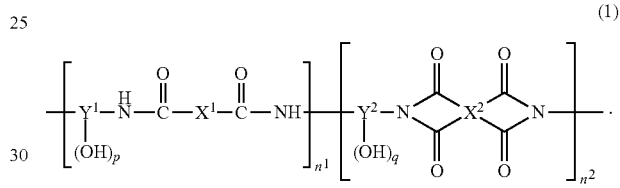

wherein $X^1$ represents a divalent organic group having 2 to 100 carbon atoms, $Y^1$ and $Y^2$ each represent a divalent to hexavalent organic group having 2 to 100 carbon atoms, $X^2$ represents a tetravalent organic group having 2 to 100 carbon atoms, p and q each represent an integer in a range of 0 to 4, and $n^1$ and $n^2$ each represent an integer in a range of 5 to 100,000, wherein (I) and (II) described below are satisfied:

(I) a divalent organic group having an aliphatic chain having 8 to 30 carbon atoms is contained as $X^1$ of the general formula (1) at a content of 30 to 70 mol % based on 100 mol % of a total of $X^1$ and $X^2$, and (II) an organic group having a diphenyl ether structure is contained as $Y^1$ of the general formula (1) at a content of 1 to 30 mol % based on 100 mol % of a total of $Y^1$ and $Y^2$.

2. The alkali-soluble resin (A) according to claim 1, wherein (III) described below is further satisfied:

(III) $n^1$ and $n^2$ of the general formula (1) satisfy $n^1/n^2$=10 to 20.

3. The alkali-soluble resin (A) according to claim 1, wherein a polyether structure represented by a general formula (2) is contained as $Y^1$ or $Y^2$ of the general formula (1) at a content of 1 to 20 mol % based on 100 mol % of the total of $Y^1$ and $Y^2$,

[Chem. 2]

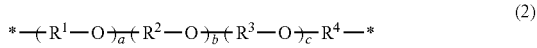

the general formula (2) shown above wherein $R^1$ to $R^4$ each independently represent an alkylene group having 2 to 10 carbon atoms, a, b, and c represent an integer in a range of $1 \leq a \leq 20$, an integer in a range of $0 \leq b \leq 20$, and an integer in a range of $0 \leq c \leq 20$ respectively, a sequence of repeating units is in a block manner or in a random manner, and * represents a chemical bond.

4. A photosensitive resin composition comprising:
the alkali-soluble resin (A) according to claim 1;
a photosensitizer (B); and
a solvent (C).

5. The photosensitive resin composition according to claim 4, wherein a compound (D) having a boiling point of 150 to 250° C., a melting point of −30° C. or less, and a molecular weight of 100 or more is contained at a content of 0.1 to 50 parts by mass among 100 parts by mass of the solvent (C).

6. The photosensitive resin composition according to claim 5, wherein the compound (D) is a compound (D-2)

having a boiling point of 150 to 250° C., a melting point of −45° C. or less, and a molecular weight of 100 or more.

7. The photosensitive resin composition according to claim 4, wherein the alkali-soluble resin (A) contains a polyhydroxyamide having a polybenzoxazole precursor structure, and the polyhydroxyamide cured at a temperature of 200° C. has a ring closure rate of 0 to 60%.

8. A photosensitive sheet comprising the photosensitive resin composition according to claim 5.

9. The photosensitive sheet according to claim 8, wherein the alkali-soluble resin (A) contains a polyhydroxyamide having a polybenzoxazole precursor structure, and the polyhydroxyamide cured at a temperature of 200° C. has a ring closure rate of 0 to 60%.

10. A cured film comprising the photosensitive resin composition according to claim 4 that is cured, or the photosensitive sheet.

11. The cured film according to claim 10, wherein the compound (D) is contained at a content of 0.05 to 5,000 ppm.

12. An interlayer insulating film or a semiconductor protective film, comprising the cured film according to claim 10.

13. A method for producing a relief pattern of a cured film, the method comprising the steps of:
    applying the photosensitive resin composition according to claim 4 on a substrate, or laminating a substrate with the photosensitive sheet, and drying the photosensitive resin composition or the photosensitive sheet to form a photosensitive resin film on the substrate;
    exposing the photosensitive resin film to light through a mask;
    removing an exposed portion or an unexposed portion of the photosensitive resin film with an alkaline solution to develop the photosensitive resin film; and
    heat-treating the developed photosensitive resin film to obtain a cured film.

14. An electronic component or a semiconductor device, comprising a layer in which the cured film according to claim 10 is placed.

15. An electronic component or a semiconductor device, comprising:
    redistribution lines; and
    the cured film according to claim 10 that is placed as an interlayer insulating film between the redistribution lines.

16. The electronic component or the semiconductor device according to claim 15, wherein the redistribution line is a copper metal line, and a width of the copper metal line and a distance between adjacent copper metal lines are 5 μm or less.

17. An electronic component or a semiconductor device, comprising:
    a sealing resin substrate;
    a silicon chip that is placed on the sealing resin substrate;
    redistribution lines; and
    the cured film according to claim 10 that is placed, as an interlayer insulating film between the redistribution lines, on the sealing resin substrate.

* * * * *